(12) United States Patent
Yamazaki et al.

(10) Patent No.: US 8,021,958 B2
(45) Date of Patent: Sep. 20, 2011

(54) METHOD FOR MANUFACTURING SOI SUBSTRATE AND METHOD FOR MANUFACTURING SEMICONDUCTOR DEVICE

(75) Inventors: Shunpei Yamazaki, Setagaya (JP); Eriko Nishida, Atsugi (JP); Takashi Shimazu, Machida (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 75 days.

(21) Appl. No.: 12/410,654

(22) Filed: Mar. 25, 2009

(65) Prior Publication Data

US 2009/0246934 A1 Oct. 1, 2009

(30) Foreign Application Priority Data

Mar. 26, 2008 (JP) ................. 2008-079650

(51) Int. Cl.
*H01L 21/78* (2006.01)
(52) U.S. Cl. .......... 438/455; 257/E21.599; 257/E21.085
(58) Field of Classification Search .................. 438/455, 438/458, 765, 770; 257/E21.482, E21.497, 257/E21.001, E21.085, E21.599
See application file for complete search history.

(56) References Cited

U.S. PATENT DOCUMENTS

| | | | |
|---|---|---|---|
| 5,374,564 A | 12/1994 | Bruel | |
| 6,271,101 B1 | 8/2001 | Fukunaga | |
| 6,335,231 B1 | 1/2002 | Yamazaki et al. | |
| 6,372,609 B1 | 4/2002 | Aga et al. | |
| 6,380,046 B1 | 4/2002 | Yamazaki | |
| 6,534,380 B1 | 3/2003 | Yamauchi et al. | |
| 6,602,761 B2 | 8/2003 | Fukunaga | |
| 6,777,713 B2 | 8/2004 | Miyairi et al. | |
| 6,803,264 B2 | 10/2004 | Yamazaki et al. | |
| 6,803,296 B2 | 10/2004 | Miyairi | |
| 6,875,633 B2 | 4/2005 | Fukunaga | |
| RE39,484 E | 2/2007 | Bruel | |
| 7,199,024 B2 | 4/2007 | Yamazaki | |
| 7,199,027 B2 | 4/2007 | Ichijo et al. | |
| 7,348,222 B2 | 3/2008 | Shimomura et al. | |

(Continued)

FOREIGN PATENT DOCUMENTS

JP 02-054532 2/1990

(Continued)

OTHER PUBLICATIONS

Zehner et al., "Preparation of atomically clean silicon surfaces by pulsed laser irradiation", Applied Physics Letters vol. 36, No. 1 (1980): pp. 56-59.*

*Primary Examiner* — Matthew Smith
*Assistant Examiner* — Michelle Fan
(74) *Attorney, Agent, or Firm* — Eric J. Robinson; Robinson Intellectual Property Law Office, P.C.

(57) ABSTRACT

A method for manufacturing an SOI substrate in which crystal defects of a single crystal semiconductor layer are reduced is provided. An oxide film containing halogen is formed on each of surfaces of a single crystal semiconductor substrate and of a semiconductor substrate provided with a single crystal semiconductor layer separated from the single crystal semiconductor substrate, whereby impurities that exist on the surfaces of and inside the substrates are decreased. In addition, the single crystal semiconductor layer provided over the semiconductor substrate is irradiated with a laser beam, whereby crystallinity of the single crystal semiconductor layer is improved and planarity is improved.

34 Claims, 23 Drawing Sheets

U.S. PATENT DOCUMENTS

| | | |
|---|---|---|
| 7,473,592 B2 | 1/2009 | Yamazaki et al. |
| 7,476,576 B2 | 1/2009 | Yamazaki et al. |
| 2002/0109144 A1 | 8/2002 | Yamazaki |
| 2004/0038504 A1* | 2/2004 | Ito ............................... 438/520 |
| 2005/0064632 A1* | 3/2005 | Sakurada et al. ............. 438/149 |
| 2006/0014330 A1* | 1/2006 | Ichikawa et al. ............. 438/149 |
| 2007/0173000 A1 | 7/2007 | Yamazaki |
| 2007/0281172 A1* | 12/2007 | Couillard et al. ............. 428/446 |
| 2008/0061301 A1 | 3/2008 | Yamazaki |
| 2008/0067529 A1 | 3/2008 | Yamazaki |
| 2008/0067597 A1 | 3/2008 | Yamazaki |
| 2008/0083953 A1 | 4/2008 | Yamazaki |
| 2008/0213953 A1 | 9/2008 | Yamazaki |
| 2008/0246109 A1 | 10/2008 | Ohnuma et al. |
| 2008/0261376 A1 | 10/2008 | Yamazaki et al. |
| 2008/0261379 A1 | 10/2008 | Jinbo et al. |
| 2008/0268263 A1 | 10/2008 | Yamazaki |
| 2008/0280420 A1 | 11/2008 | Yamazaki |
| 2008/0286911 A1 | 11/2008 | Miyairi |
| 2008/0286941 A1 | 11/2008 | Yamazaki |
| 2008/0286942 A1 | 11/2008 | Yamazaki |
| 2008/0286952 A1 | 11/2008 | Miyairi et al. |
| 2008/0286956 A1 | 11/2008 | Yamazaki |
| 2008/0299743 A1 | 12/2008 | Miyairi |
| 2008/0311709 A1 | 12/2008 | Ohnuma |
| 2009/0115028 A1 | 5/2009 | Shimomura et al. |
| 2009/0197391 A1 | 8/2009 | Ohnuma et al. |
| 2009/0246936 A1 | 10/2009 | Yamazaki et al. |
| 2009/0246937 A1 | 10/2009 | Yamazaki et al. |
| 2009/0261449 A1 | 10/2009 | Yamazaki et al. |

FOREIGN PATENT DOCUMENTS

| | | |
|---|---|---|
| JP | 05-211128 | 8/1993 |
| JP | 2000-012864 | 1/2000 |
| JP | 2000-294754 | 10/2000 |
| JP | 2005-252244 | 9/2005 |

* cited by examiner

FIG. 1A
FIG. 1E
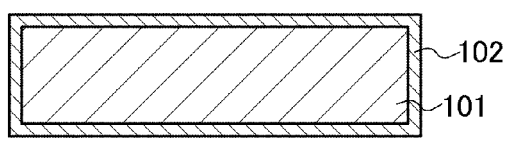
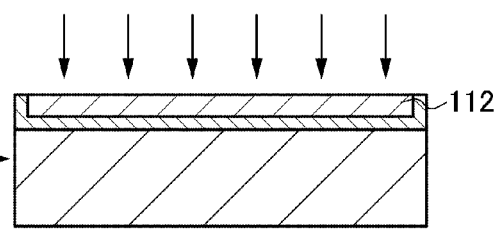
FIG. 1B
FIG. 1F
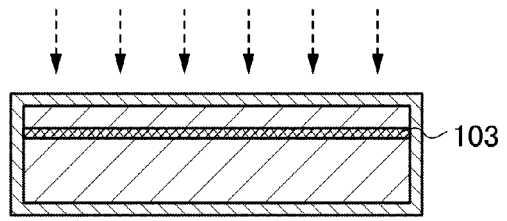
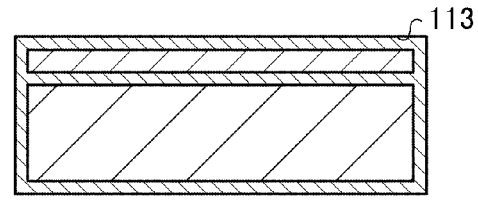
FIG. 1C
FIG. 1G
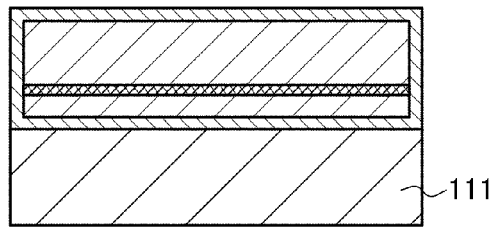
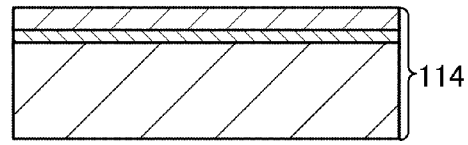
FIG. 1D
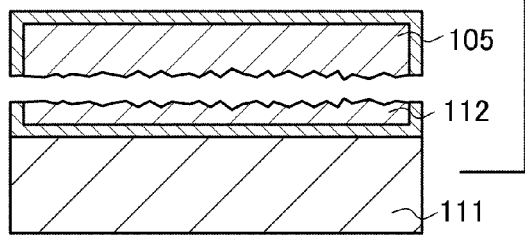

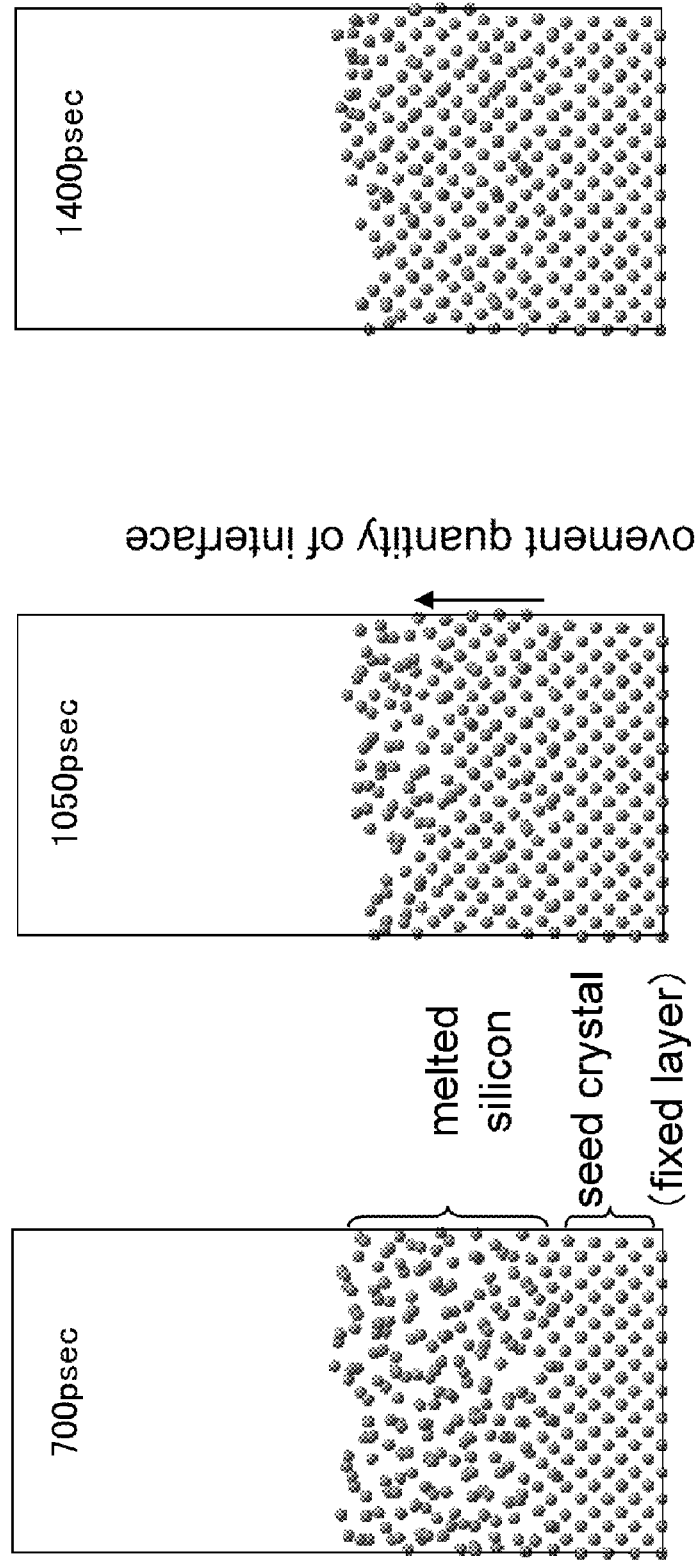

FIG. 15

| Accelerating voltage | Ratio of amount of (H) (X : Y) | Ratio of hydrogen ion species (X : Y/3) |
|---|---|---|
| 80 kV | 1 : 44.1 | 1 : 14.7 |
| 60 kV | 1 : 42.5 | 1 : 14.2 |
| 40 kV | 1 : 43.5 | 1 : 14.5 |

METHOD FOR MANUFACTURING SOI SUBSTRATE AND METHOD FOR MANUFACTURING SEMICONDUCTOR DEVICE

BACKGROUND OF THE INVENTION

1. Field of the Invention

The present invention relates to a method for manufacturing an SOI substrate having a semiconductor layer formed over an insulating film and a method for manufacturing a semiconductor device.

2. Description of the Related Art

Background Art

In recent years, instead of a bulk silicon wafer, integrated circuits using an SOI (silicon on insulator) substrate have been developed. By utilizing the characteristics of a thin silicon wafer formed over an insulating film, semiconductor layers of transistors formed in the integrated circuit can be separated from each other completely. Further, since the fully depleted transistors can be formed, a semiconductor integrated circuit with high added value such as high integration, high speed driving, and low power consumption can be realized.

Known examples of SOI substrates are SIMOX substrates and bonded substrates. For example, an SOI structure of a SIMOX substrate is obtained by implantation of oxygen ions into a silicon wafer and by heat treatment performed at equal to or higher than 1300° C. to form a buried oxide (BOX) film, whereby a silicon wafer is formed on a substrate surface.

As an SOI structure of a bonded substrate, two silicon wafers (a base substrate and a bond substrate) are bonded to each other with an oxide film interposed therebetween, and one of the two silicon wafers (the bond substrate) is thinned on its rear side (which is a surface facing a bonded surface), so that a silicon wafer is formed. There is proposed a technique which employs hydrogen ion implantation that is called a hydrogen ion implantation separation method (e.g., Reference 1: Japanese Published Patent Application No. H5-211128), because it is difficult to form a uniform silicon wafer by grinding or polishing. The hydrogen ion implantation separation method is also called a Smart Cut (registered trademark) method.

A summary of a method for manufacturing this SOI substrate is described. By implantation of hydrogen ions into a silicon wafer by an ion implantation method, an embrittlement region is formed at a predetermined depth from the surface of the silicon wafer. Next, a silicon oxide film is formed by oxidizing another silicon wafer which serves as a base substrate. Then, the silicon wafer into which the hydrogen ions are implanted is bonded to the silicon oxide film of the other silicon wafer which serves as a base substrate, so that the two silicon wafers are bonded. Then, through heat treatment, the silicon wafer is cleaved using the ion implanted layer as a cleavage plane, thereby forming a substrate in which a thin single crystal silicon layer is bonded to the silicon wafer which serves as a base substrate.

An ion implantation method is a method in which particles to be implanted into a sample in vacuum are ionized and accelerated by an electric field. An ion implanter used in an ion implantation method includes an ion source, a mass separation unit, an acceleration unit, a beam operation portion (electrostatic scan) unit, an implantation chamber (end-station), and an evacuation unit. Further, since a cross section of an ion beam is not uniform, scanning with an ion beam is performed electrically in order to obtain uniformity of a surface of the sample. The implanted particles have a Gaussian distribution in the depth direction.

In addition, a method for manufacturing a semiconductor device using the Smart Cut method, in which a highly heat-resistant substrate is used as a supporting substrate, is disclosed as an example of a semiconductor device using an SOI substrate (see Reference 2: Japanese Published Patent Application No. 2000-012864).

SUMMARY OF THE INVENTION

In the case where a single crystal semiconductor film is formed using the ion implantation separation method, defects in the single crystal semiconductor film is increased due to the addition of ions. For example, in the case where there are a large number of defects in the single crystal semiconductor film, a defect level is easily formed at an interface with a gate insulating layer; therefore, characteristics of a semiconductor element formed using this single crystal semiconductor film is not good. In addition, crystallinity and planarity are impaired on the surface of the single crystal semiconductor film after separation.

In addition, the take time in forming an embrittlement region can be reduced by using an ion doping method, instead of a conventional ion implantation method which is used for formation of an embrittlement region in a conventional method for manufacturing an SOI substrate. In an ion implantation method here, a source gas is made into plasma, ion species included in this plasma are extracted and mass-separated, ion species with predetermined mass are accelerated, and an object is irradiated with the accelerated ion species as an ion beam. In an ion doping method, a source gas is made into plasma, ion species are extracted from this plasma by an operation of a predetermined electric field, the extracted ion species are accelerated without mass separation, and an object is irradiated with the accelerated ion species as an ion beam.

In contrast, mass separation is not performed in an ion doping method; therefore, there is a risk that an impurity such as metal included in a material of an electrode and the like of an ion doping apparatus enters a silicon wafer together with the hydrogen ions. An SOI substrate contaminated by an impurity causes a decrease in electrical characteristics and reduction in reliability of a transistor, such as change of threshold voltage of a transistor and increase of leakage current.

In the foregoing problems, it is an object of one embodiment of the present invention to provide a method for manufacturing an SOI substrate having a single crystal semiconductor layer with reduced crystal defects.

It is an object of one embodiment of the present invention to provide a method for manufacturing an SOI substrate in which an influence of contamination by an impurity such as metal can be suppressed.

It is an object of the present invention to provide a method for manufacturing a semiconductor device having excellent electric characteristics by using such an SOI substrate.

A method for manufacturing an SOI substrate of one embodiment of the present invention is to form an oxide film containing halogen on each of surfaces of a single crystal semiconductor substrate and of a semiconductor substrate provided with a single crystal semiconductor layer that is separated from the single crystal semiconductor substrate. In addition, one feature is that the single crystal semiconductor layer provided over the semiconductor substrate is irradiated with a laser beam. Hereinafter, a specific structure of one embodiment of the present invention is described.

A method for manufacturing an SOI substrate of one embodiment of the present invention includes the following steps: forming a first oxide film on a surface of a single crystal semiconductor substrate by performing first thermal oxidation treatment on the single crystal semiconductor substrate; forming an embrittlement region in the single crystal semiconductor substrate by irradiating the single crystal semiconductor substrate with ions through the first oxide film; bonding a surface of the first oxide film over the single crystal semiconductor substrate and a surface of a semiconductor substrate; forming a single crystal semiconductor layer over the semiconductor substrate with the first oxide film interposed therebetween by separating the single crystal semiconductor substrate by heat treatment at the embrittlement region; irradiating the single crystal semiconductor layer with a laser beam; forming a second oxide film over the single crystal semiconductor layer by performing second thermal oxidation treatment on the semiconductor substrate; and removing the second oxide film.

Note that the term "single crystal" in this specification refers to a crystal in which crystal faces or crystal axes are aligned and atoms or molecules which are included in the single crystal are aligned in a spatially ordered manner. However, although single crystals are structured by orderly aligned atoms, single crystals may include a lattice defect in which part of the alignment is disordered or single crystals may include intended or unintended lattice distortion.

Note that a semiconductor device in this specification refers to all devices which can function by utilizing semiconductor characteristics, and electro-optical devices, semiconductor circuits, and electronic appliances are all semiconductor devices.

In this specification, a display device includes liquid crystal display devices and light-emitting devices. The liquid crystal display device includes a liquid crystal element, and the light-emitting device includes a light-emitting element. A light-emitting element includes, in its category, an element whose luminance is controlled by current or voltage, and specifically includes, in its category, an inorganic electroluminescence (EL) element, an organic EL element, and the like.

According to one embodiment of the present invention, in manufacturing an SOI substrate or a semiconductor device, an SOI substrate having a single crystal semiconductor layer with reduced crystal defects can be manufactured. In addition, according to one embodiment of the present invention, an SIO substrate in which an influence of contamination by an impurity is suppressed can be manufactured. Further, according to one embodiment of the present invention, by using such an SOI substrate, a semiconductor device having excellent electronic characteristics can be manufactured.

BRIEF DESCRIPTION OF THE DRAWINGS

FIGS. 1A to 1G are diagrams illustrating an example of a method for manufacturing an SOI substrate.

FIGS. 4A to 4C are states of a structural change by calculation (cross-sectional views of a YZ plane).

FIG. 15 is a list of ratios of fitting parameters (hydrogen atom ratios and hydrogen ion species ratios).

DETAILED DESCRIPTION OF THE INVENTION

Embodiment Mode

Figure 2A:
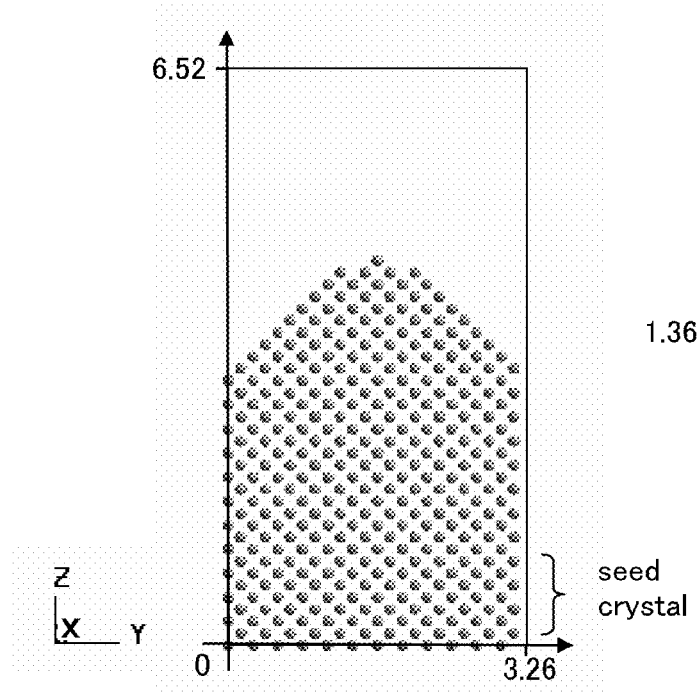
FIG. 2A is a calculation model.

The present invention will be fully described by way of embodiment modes with reference to the accompanying drawings. However, the present invention can be carried out in many different modes, and it is easily understood by those skilled in the art that modes and details of the present invention can be modified in various ways without departing from the spirit and scope of the present invention. Therefore, the present invention should not be interpreted as being limited to the following description of the embodiment modes. Note that in all the drawings for describing the embodiment modes, the same portions or portions having the same functions are denoted by the same reference numerals, and the descriptions thereof are omitted.

Embodiment Mode 1

In this embodiment mode, an example of a method for manufacturing an SOI substrate will be described with reference to drawings.

First, a single crystal semiconductor substrate 101 is prepared and washed using a sulfuric acid/hydrogen peroxide mixture (SPM), an ammonium hydroxide/hydrogen peroxide mixture (APM), a hydrochloric acid/hydrogen peroxide mixture (HPM), dilute hydrogen fluoride (DHF), ozone water, or the like as appropriate. As the single crystal semiconductor substrate 101, a commercial single crystal semiconductor substrate can be used. For example, a single crystal silicon substrate, a single crystal germanium substrate, and a compound semiconductor substrate of gallium arsenide, indium phosphide, or the like can be used. A size of a commercial silicon substrate is typically 5 inches (125 mm) in diameter, 6 inches (150 mm) in diameter, 8 inches (200 mm) in diameter, 12 inches (300 mm) in diameter, or 18 inches (450 mm) in diameter, and a typical shape thereof is a circular shape. Note that the silicon substrate is not limited to having a circular shape, and a silicon substrate processed to have a rectangular shape or the like can be used. In the description given below, the case where a single crystal silicon substrate is used as the single crystal semiconductor substrate 101 is described.

Next, an oxide film 102 (also referred to as a first oxide film) is formed by performing thermal oxidation treatment (also referred to as first thermal oxidation treatment) on the single crystal semiconductor substrate 101 (FIG. 1A). As thermal oxidation treatment, oxidation in an oxidizing atmosphere to which halogen is added is preferably performed. As the gas used for adding halogen to an oxidizing atmosphere, one or more kinds of gases selected from HCl, HF, $NF_3$, HBr, $Cl_2$, dichloroethylene (DCE), $ClF_3$, $BCl_3$, $F_2$, $Br_2$, or the like can be used. As an example of such thermal oxidation treatment, it is preferable that thermal oxidation treatment be performed in an atmosphere containing HCl at 0.5 vol. % to 10 vol. % (preferably, 3 vol. %) with respect to oxygen and at a temperature of 900° C. to 1150° C. (typically, 1000° C.). Treatment time may be 0.1 to 6 hours, preferably 0.5 to 1 hour. The film thickness of an oxide film which is to be formed is 10 nm to 1000 nm (preferably, 50 nm to 300 nm), for example, 200 nm. Since the decomposition temperature of trans-1,2-dichloroethylene is low, trans-1,2-dichloroethylene is suitable for low temperature thermal oxidation treatment in the case where dichloroethylene is used. Note that, as well as trans-1,2-dichloroethylene, cis-1,2-dichloroethylene, 1,1-dichloroethylene, or a mixed gas of at least two kinds of the gases may be used.

By heat treatment being performed in such a temperature range, an effect of removing an impurity in the single crystal semiconductor substrate 101 can be obtained. That is, even when there is an impurity (e.g., metal) in the single crystal semiconductor substrate 101, the impurity is turned into volatile halide (e.g., chloride), moved into the air, and removed by the action of halogen (e.g., chlorine). This effect is useful for the case where a surface of the single crystal semiconductor substrate 101 is subjected to chemical mechanical polishing (CMP) treatment. Note that chemical mechanical polishing (abbreviation: CMP) is treatment for planarizing a surface by polishing chemically and mechanically using slurry in which an alkaline solution and polishing abrasive grains are mixed.

The oxide film 102, which is formed by performing thermal oxidation with halogen being added, contains halogen. Note that halogen is contained at a concentration which is equal to or higher than $1\times10^{16}$ atoms/$cm^3$ and equal to or lower than $2\times10^{21}$ atoms/$cm^3$, so that the oxide film 102 can have a function as a protective film which captures an impurity such as metal so as to prevent contamination of the single crystal semiconductor substrate 101.

The halogen contained in the oxide film 102 can contain fluorine as well as chlorine. In this case, it is preferable that a smaller amount of fluorine than chlorine be contained.

Further, inclusion of hydrogen in the gas for the thermal oxidation treatment has an effect of compensating a defect at the interface between the single crystal semiconductor substrate 101 and the oxide film 102 to decrease the localized state density of the interface. Therefore, it is preferable that the oxide film 102 contain hydrogen atoms at equal to or higher than $1\times10^{18}$ atoms/$cm^3$.

Note that in this embodiment mode, the case is described in which thermal oxidation treatment is performed in an oxidizing atmosphere which contains hydrogen chloride or dichloroethylene as a method for forming the oxide film 102 containing halogen; however, implementation of the present invention is not limited thereto. For example, thermal oxidation treatment in an oxidizing atmosphere such as dry oxidation may be performed on the single crystal semiconductor substrate 101, and the oxide film 102 (e.g., $SiO_x$) may be formed on the surface of the single crystal the single crystal semiconductor substrate 101. Then, the oxide film 102 may be added with halide ions such as chlorine ions accelerated by an electric field by using an ion doping apparatus or an ion implanter, so that halogen atoms such as chlorine atoms may be contained in the oxide film 102. Alternatively, after the surface may be processed with a hydrogen chloride (HCl) solution, thermal oxidation treatment may be performed in an oxidizing atmosphere.

Next, through the oxide film 102, the single crystal semiconductor substrate is irradiated with ions, so that the ions are introduced into the single crystal semiconductor substrate; accordingly, an embrittlement region 103 is formed in a region at a predetermined depth from one of surfaces of the single crystal semiconductor substrate 101 (see FIG. 1B).

The depth at which the embrittlement region 103 is formed can be adjusted by ion species, kinetic energy of ions, and incidence angle of ions. The kinetic energy can be adjusted by acceleration voltage, or the like. The embrittlement region 103 is formed at the same depth or substantially the same depth as an average penetration depth of the ions. The depth to which ions are introduced determines the thickness of the single crystal semiconductor layer separated from the single crystal semiconductor substrate 101 in a later step. The depth at which the embrittlement region 103 is formed is in the range of equal to or more than 10 nm and equal to or less than 500 nm, and the depth is preferably in the range of equal to or more than 50 nm and equal to or less than 200 nm.

Ions can be introduced into the single crystal semiconductor substrate 101 by use of an ion doping apparatus. In an ion doping apparatus, a source gas is excited to generate plasma, ion species are extracted from the plasma, and the ion species which are not mass-separated are introduced into the object. By the use of the ion doping apparatus, the single crystal semiconductor substrate 101 can be homogeneously doped. Note that in an ion doping apparatus provided with a mass separator, ion implantation with mass separation can be performed.

In the case where an ion doping method is used, as a source gas which is used for adding ions, a hydrogen gas, a noble gas, and the like are given. In this embodiment mode, a hydrogen gas is preferably used. When a hydrogen gas is used as a source gas, ions which are generated are $H^+$, $H_2^+$, and $H_3^+$, and it is preferable that $H_3^+$ be the largest number of ions introduced to the single crystal semiconductor substrate. $H_3^+$ has higher introduction efficiency than $H^+$ or $H_2^+$, so that introduction time can be reduced. Further, a crack is easily generated in the embrittlement region 103 in a later step.

$H_3^+$ has larger mass than $H^+$ and $H_2^+$. When the ion beam containing a larger proportion of $H_3^+$ is compared with the ion beam containing a larger proportion of $H^+$ and $H_2^+$, the former can introduce hydrogen to a shallower region of the single crystal semiconductor substrate 101 than the latter even though the acceleration voltage at the time of doping is the same. Further, the former has a steep concentration profile of hydrogen introduced to the single crystal semiconductor substrate 101 in a thickness direction, and the embrittlement region 103 itself can be formed to be thinner.

When an ion doping method is employed as described above, since the ion doping apparatus introduces ions without mass separation, metals are introduced to the single crystal semiconductor substrate 101 together with hydrogen ions in some cases. Since a metal has the large mass number, most metals are distributed in a top surface on the ion introduction side. In this embodiment mode, the oxide film 102 is formed on the surface of the single crystal semiconductor substrate 101. When the oxide film 102 is formed thicker than the depth at which the metals are introduced, the distribution of the metal can be kept within the oxide film 102. When halogen is contained in the oxide film 102, the oxide film 102 has an effect of fixing an impurity such as heavy metal which has an adversary effect on the single crystal semiconductor substrate 101. Accordingly, contamination of the single crystal semiconductor substrate 101 can be prevented.

Next, a semiconductor substrate 111 to be bonded to the single crystal semiconductor substrate 101 is prepared. As the semiconductor substrate 111, a substrate similar to the substrate used as the single crystal semiconductor substrate 101 can be used. Further, a polycrystal semiconductor substrate, a solar grade silicon (SOG-Si, e.g., Si purity is 99.9999%) substrate which is used for manufacturing solar cells, or the like can be used. The polycrystalline semiconductor substrate described in this specification refers not only to a polycrystalline silicon substrate but also to a polycrystalline compound semiconductor substrate, a polycrystalline silicon substrate that contains a very small amount of germanium, and a polycrystalline silicon substrate that contains a very small amount of boron.

In order to favorably perform bonding between the semiconductor substrate 111 and the oxide film 102, a bonding surface may be activated. For example, one or both of the bonding surfaces are irradiated with an atomic beam or an ion beam. When an atomic beam or an ion beam is used, an inert gas neutral atom beam or inert gas ion beam of argon or the like can be used. It is also possible to activate the bonding surface by plasma irradiation or radical treatment. Such activation treatment facilitates bonding between the single crystal semiconductor substrate and the semiconductor substrate even at a temperature of equal to or lower than 400° C.

Next, bonding is performed such that the oxide film 102 and one surface of the semiconductor substrate 111 face each other (FIG. 1C). The oxide film 102 and the semiconductor substrate 111 are placed in close contact with each other, whereby the substrates attract each other by van der Waals forces. Then, bonding of Si—OH formed on the surface of the substrate is performed by a hydrogen bond. A dehydration condensation reaction is caused by low temperature heat treatment (e.g., 150° C. to 200° C.), and water molecules are separated to form a bond (Si—O—Si) in which an oxygen atom is interposed between silicon atoms. Furthermore, by performing high temperature heat treatment (e.g., 600° C.), oxygen diffuses, and Si bonding is performed at the interface, so that bonding between the single crystal semiconductor substrate 101 and the semiconductor substrate 111 is stronger. In this embodiment mode, the oxide film 102 obtained by thermal oxidation treatment is used as an adhesive film between the single crystal semiconductor substrate 101 and the semiconductor substrate 111. Since the oxide film 102 obtained by thermal oxidation treatment has smoothness, bonding between the single crystal semiconductor substrate 101 and the semiconductor substrate 111 can be performed well.

Note that it is preferable that surface treatment be performed on the oxide film 102 formed on the single crystal semiconductor substrate 101 and on the semiconductor substrate 111 before the single crystal semiconductor substrate 101 and the semiconductor substrate 111 are bonded to each other. As surface treatment, ozone treatment (e.g., cleaning with ozone water) or megasonic cleaning and cleaning with ozone water can be performed. Further, cleaning with ozone water and cleaning with hydrofluoric acid may be repeated plural times. With such surface treatment, dust such as an organic substance on the surfaces of the oxide film 102 and the semiconductor substrate 111 can be removed and the surface of the oxide film 102 can be made hydrophilic.

After the single crystal semiconductor substrate 101 and the semiconductor substrate 111 are bonded to each other, it is preferable to perform either heat treatment or pressure treatment or the both. Heat treatment or pressure treatment makes it possible to increase bonding strength between the single crystal semiconductor substrate 101 and the semiconductor substrate 111. The heat treatment is performed at temperature at which elements or molecules added to the embrittlement region 103 are not separated out; specifically, the temperature is preferably equal to or lower than 350° C. In other words, this heating temperature is a temperature at which a gas is not released from the embrittlement region 103. The pressure treatment is performed so that pressure is applied perpendicularly to the bonding surface, in consideration of the pressure resistance of the single crystal semiconductor substrate 101 and the semiconductor substrate 111.

Next, heat treatment is performed on the single crystal semiconductor substrate 101, whereby the single crystal semiconductor substrate 101 is separated at the embrittlement region 103, and the semiconductor substrate 111 to which a single crystal semiconductor layer 112 is bonded and a single crystal semiconductor substrate 105 are separated from each other (FIG. 1D). For heat treatment here, a rapid thermal anneal (RTA) apparatus, a lamp rapid thermal anneal (LRTA) apparatus which is heated by a halogen lamp or an infrared lamp, or the like can be used. It is preferable that the temperature of the semiconductor substrate 111 to which the single crystal semiconductor layer 112 is bonded be increased to a temperature in the range of equal to or higher than 550° C. and equal to or lower than 650° C. by this heat treatment.

In this embodiment mode, heat treatment by using a vertical furnace having resistance heating is performed. The semiconductor substrate 111 to which the single crystal semiconductor substrate 101 is bonded is loaded into a boat for the vertical furnace. The boat is carried in a chamber of the vertical furnace. First, the chamber is exhausted to have a vacuum state in order to suppress oxidation of the single crystal semiconductor substrate 101. A vacuum is approximately $5 \times 10^{-3}$ Pa. After making the chamber vacuum, nitrogen is supplied to the chamber so that the chamber has a nitrogen atmosphere. In this period, the temperature is increased to 200° C.

After the chamber has a nitrogen atmosphere, heat treatment is performed at 200° C. for two hours. Then, the temperature is raised to 400° C. in one hour. When the state at a heating temperature of 400° C. is stabilized, the heating temperature is raised to 600° C. in one hour. When the state at a heating temperature of 600° C. is stabilized, heat treatment is performed at 600° C. for two hours. Then, the temperature is decreased to 400° C. in one hour, and after 10 minutes to 30 minutes, the boat is carried out of the chamber. Under an atmospheric air, the single crystal semiconductor substrate 101 and the semiconductor substrate 111 on the boat are cooled.

In the above-mentioned heat treatment using a resistance heating furnace, heat treatment to increase bonding force between the single crystal semiconductor substrate 101 and the semiconductor substrate 111, and heat treatment to cause separation at the embrittlement region 103 are performed in succession. In the case where these two heat treatments are performed with different apparatuses, for example, heat treatment at a treatment temperature of 200° C. is performed for a treatment time of 2 hours in a resistance heating furnace, and the semiconductor substrate 111 and the single crystal semiconductor substrate 101, which are bonded to each other, are carried out of the furnace. Next, heat treatment is performed at a process temperature of equal to or higher than 600° C. and equal to or lower than 700° C. for equal to or more than 1 minute and equal to or less than 30 minutes in an RTA apparatus, so that the single crystal semiconductor substrate 101 is separated at the embrittlement region 103.

In this manner, heat treatment is performed to cause separation (cleavage) at the embrittlement region 103, so that the single crystal semiconductor layer 112 can be provided over the semiconductor substrate 111 with the oxide film 102 interposed therebetween (see FIG. 1D). The single crystal semiconductor substrate 105 from which the single crystal semiconductor layer 112 is separated is reused, whereby cost can be reduced. Because heating temperature is relatively low temperature of equal to or lower than 700° C., the heat treatment step illustrated in FIG. 1D is effective in the case where damage due to heat to the single crystal semiconductor substrate 105 can be suppressed and the single crystal semiconductor substrate 105 is reused.

The single crystal semiconductor layer 112 illustrated in FIG. 1D has crystal defects due to the ion introduction step for forming the embrittlement region 103 or the separation step, and the crystal defects damage the planarity of the surface of the single crystal semiconductor layer. In addition, the single crystal semiconductor layer 112 has a crystal defect in manufacturing a single crystal semiconductor substrate, which is called crystal originated particle (COP) or flow pattern particle (FPD) in some cases. Further, when the single crystal semiconductor layer 112 has crystal defects, the crystal defects have an adverse effect on the performance and reliability of a transistor, such as an increase of the localized state density at the interface between the single crystal semiconductor layer 112 and a gate insulating layer. It is difficult to form a gate insulating layer which is thin and has high withstand voltage on such a surface of the single crystal semiconductor layer 112 whose planarity is damaged.

In order to remove defects existing in the single crystal semiconductor layer 112, the surface of the single crystal semiconductor layer 112 is irradiated with a laser beam (see FIG. 1E). The single crystal semiconductor layer 112 is irradiated with a laser beam, whereby the single crystal semiconductor layer 112 can be melted. The melted portion in the single crystal semiconductor layer 112 with the laser beam is cooled and solidified, so that planarity thereof is improved. In addition, crystal defects of the single crystal semiconductor layer 112 are reduced together with improvement in planarization by laser irradiation, so that crystallinity of the single crystal semiconductor layer 112 can be improved. With use of the laser beam, the semiconductor substrate 111 is not directly heated; thus, an increase in the temperature of the semiconductor substrate 111 can be suppressed.

Note that it is preferable that the single crystal semiconductor layer 112 be partly melted by the laser irradiation. This is because, if the single crystal semiconductor layer is completely melted, it is microcrystallized due to disordered nucleation after being in a liquid phase, so that crystallinity of the single crystal semiconductor layer is highly likely to decrease. On the contrary, by partial melting, crystal growth proceeds from a solid phase portion, which is not melted. Accordingly, crystal defects in the semiconductor film can be reduced. Here, complete melting means that the single crystal semiconductor layer 112 is melted to the lower interface to be made in a liquid state. On the other hand, partial melting means that the upper part of the single crystal semiconductor layer 112 is melted to be made in a liquid phase whereas the lower part is kept in a solid phase without being melted.

Although a laser oscillating the laser beam may be a continuous wave laser, a quasi continuous wave laser, or a pulsed laser, it is preferable to use a pulsed laser. This is because a high-energy pulsed laser beam can be emitted instantaneously and the partial melting state can be easily obtained. The repetition rate is preferably equal to or greater than 1 Hz and equal to or less than 10 MHz.

As the laser, for example, as a gas laser, an excimer laser such as a KrF laser, an Ar laser, a Kr laser, or the like can be used. Alternatively, as a solid-state laser, a YAG laser, a $YVO_4$ laser, a YLF laser, a $YAlO_3$ laser, a $GdVO_4$ laser, a KGW laser, a KYW laser, an alexandrite laser, a Ti:sapphire laser, a $Y_2O_3$ laser, or the like may be used. An excimer laser is a pulsed laser, and some solid lasers such as a YAG laser can be used as a continuous laser, a quasi continuous laser, and a pulsed laser.

A wavelength of the laser beam is a wavelength that is absorbed in the single crystal semiconductor layer 112, which can be determined by considering the skin depth of the single crystal semiconductor layer 112 with respect to the laser beam, and the like. For example, the wavelength can be in the range of equal to or more than 250 nm and equal to or less than 700 nm. Further, the energy of the laser beam can be determined in consideration of the wavelength of the laser beam, the skin depth of the single crystal semiconductor layer 112 with respect to the laser beam, the thickness of the single crystal semiconductor layer 112, or the like. The energy of the laser beam can be, for example, in the range of equal to or greater than 300 $mJ/cm^2$ and equal to or less than 800 $mJ/cm^2$. Irradiation with the laser beam can be performed in an atmosphere containing oxygen such as the atmospheric air or an inert atmosphere such as a nitrogen atmosphere. An inert atmosphere such as a nitrogen atmosphere can improve planarity of the single crystal semiconductor layer 112 with higher effect than the atmospheric air, and can suppress generation of a crack with higher effect than the atmospheric air.

Here, repairing surface unevenness and nanoscale crystal defects of a single crystal semiconductor layer by laser irradiation is calculated by classical molecular dynamics simulation. Specifically, a process is described, in which an upper part of a single crystal semiconductor layer having surface unevenness and nanoscale crystal defects is heated to melt the single crystal semiconductor layer partially, and atoms are rearranged by using solid phases left on a lower part as seed crystal. Note that in this calculation, the case where a single crystal silicon layer is formed as the single crystal semiconductor layer was used as an example.

In the classical molecular dynamics method, a function (interatomic potential) which corresponds to movement of real atoms is made and force acting on each atom is evaluated with use of the function, and Newton's equation of motion is solved, whereby motion (time evolution) of each atom can be tracked. In the actual simulation procedure, the following cycle is repeated.

(1) initial conditions such as initial coordinates and initial speed (temperature) are given to atoms in simulation.
(2) atomic force is calculated by using interatomic potential.
(3) positions and speed of atoms after time step At are calculated.
(4) operation returns to (2).

In accordance with the above procedure, temporal trajectories of each atom can be evaluated. Note that as software of the classical molecular dynamics simulation for performing the above simulation, Materials Explorer 5.0 manufactured by Fujitsu Limited was used.

A variety of models are proposed for interatomic potential of silicon. In this simulation, Tersoff potential is used, which can reproduce physical property values which are obtained from experiments in actual conditions most favorably. Note that there is a certain difference between temperature of the Tersoff model and real temperature. However, the difference is just an artifact in simulation, and the temperature of the Tersoff model can be converted into the real temperature based on a melting point. The experimental value of melting point of silicon is about 1414° C., which corresponds to a temperature at about 2327° C. in the Tersoff model. Hereinafter, the temperature which is converted based on the real melting point of silicon is referred to as the converted temperature for convenience.

Next, a simulation model for planarization and re-single-crystallization of a single crystal silicon layer (a (100) plane) and a simulation condition thereof are described. The size of a unit cell (a simulation unit cell) used in simulation is set to be 3.26 nm in the x-axis direction, 3.26 nm in the y-axis direction, and 6.52 nm in the z-axis direction. Here, the x-axis and the y-axis are in the direction parallel to the single crystal silicon layer, and the z-axis is in the thickness direction of the single crystal silicon layer. Note that in the simulation, the periodic boundary condition is applied in the x-axis direction and the y-axis direction so that a film which is sufficiently large in the x-axis direction and the y-axis direction can be assumed.

As a simulation model, a single crystal silicon layer having surface unevenness and nanoscale crystal defects inside was employed under the following conditions.

A projected portion in a pyramidal shape exists on a surface of the single crystal silicon layer.
The height of the projected portion (a difference in height on the surface of the single crystal silicon layer) is 1.36 nm.
Silicon atoms in a region within 1 nm in radius with a coordinate (1.63, 1.63, 2.17) as a center are removed (in total, 191 atoms), so that a spherical crystal defect of about 2 nm in diameter is formed, where each parameter of the above coordinate corresponds to a distance (nm) from the origin position.
The number of silicon atoms in the simulation unit cell is 1706.
Seven layers (in total, 504 atoms) in the lower portion of the single crystal silicon layer are seed crystal; thus, positions of atoms are fixed (assumed as a solid-phase state).

Figure 2B:
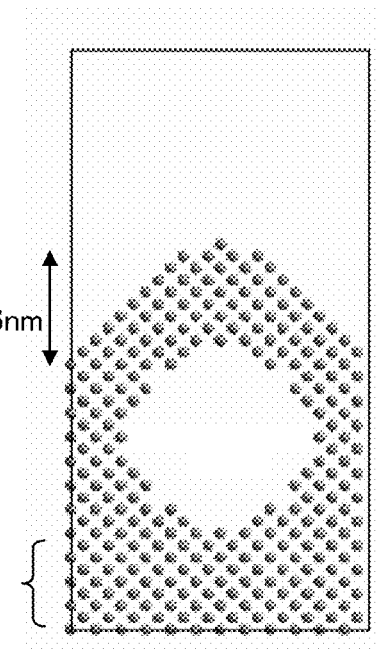
FIG. 2B is a cross-sectional view of a YZ plane of FIG. 2A.
Figure 3A:
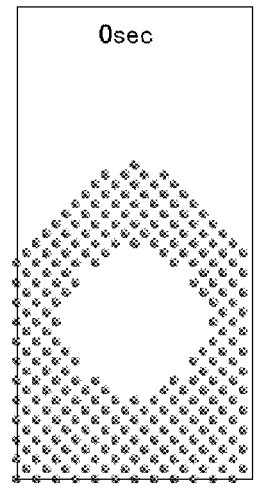
FIGS. 3A to 3F are states of a structural change by calculation (cross-sectional views of a YZ plane).
Figure 3B:
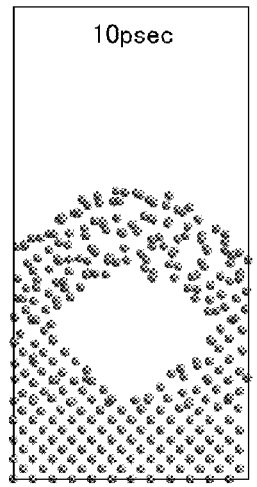
Figure 3C:
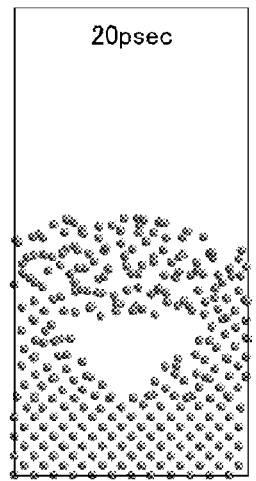
Figure 3D:
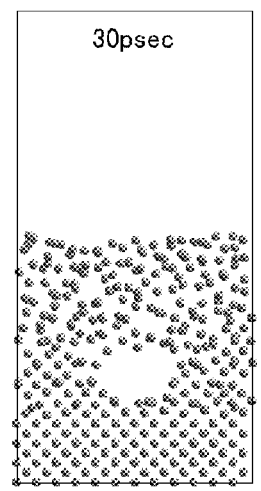
Figure 3E:
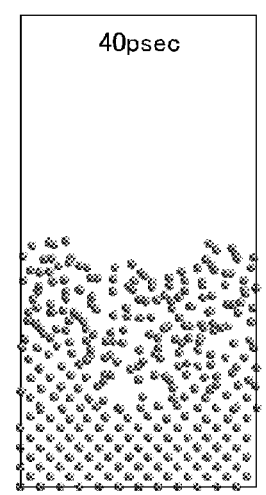
Figure 3F:
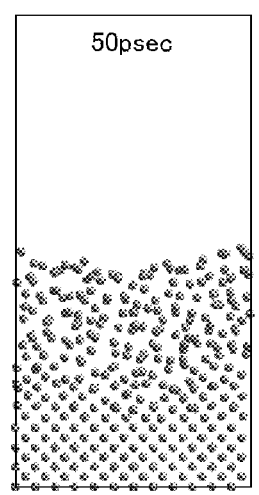

FIG. 2A illustrates the above simulation model viewed in the direction perpendicular to the y-z plan. FIG. 2B illustrates a cross-sectional view of a plane which passes through the center of the spherical crystal defect and is in parallel to the y-z plan in the above simulation model. Note that FIG. 2B illustrates the above simulation model with a thickness of 0.65 nm in the x-axis direction, which does not strictly mean that only a cross section passing through the center of the spherical crystal defect is illustrated.

With use of the above simulation model, the classical molecular dynamics simulation was performed on such initial condition of temperature that the converted temperature is at 1458° C. (equal to or higher than the melting point). In this simulation, the simulation was performed on the constant temperature condition (at a converted temperature of 1458° C.) from the initial state (0 sec) to 700 psec.

FIGS. 3A to 3F illustrate change in a structure of the single crystal silicon layer over time. In FIGS. 3A to 3F, change in a structure of the single crystal silicon layer from the initial state (0 sec) to 50 psec is shown at 10 psec intervals. In accordance with FIGS. 3A to 3C, it is found that the projected portion of the surface is melted and the crystal defect disappears at about 50 psec, so that the single crystal silicon layer is planarized.

In this calculation, after 700 psec, the classical molecular dynamics simulation was performed on such a condition that the converted temperature is lowered to 1276° C. which is equal to or lower than the melting point. Here, the temperature condition was constant (1276° C.) from 700 psec to 1400 psec. FIGS. 4A to 4C illustrate change in the structure of the single crystal silicon layer over time after 700 psec. In FIGS. 4A to 4C, change in the structure of the single crystal silicon layer from 700 psec to 1400 psec is shown at 350 psec intervals.

In accordance with FIGS. 4A to 4C, the solid-liquid interface is raised toward the surface of the single crystal silicon layer over time, and it is found that melted silicon turns into crystal silicon using the solid-phase portion as seed crystal. After 1400 psec, re-single-crystallization was conducted up to the vicinity of the surface.

As described above, the upper part of the single crystal silicon layer having surface unevenness and nanoscale crystal defects was heated and melted, whereby reduction of the surface unevenness and disappearance of the crystal defect can be verified. In addition, the silicon atoms are rearranged using the solid phases left in the lower part as seed crystal, and crystal growth proceeds.

In accordance with results of the classical molecular dynamics simulation, in the case where the crystal defect is about 2 nm in diameter and the surface unevenness has a difference in height of about 1.5 nm, defects can be completely repaired even for a melting time of about 50 psec. Further, with a melting time of at least about 700 psec, the silicon atoms can be rearranged (re-single-crystallized) using solid phases left in the lower part as seed crystal. The melting time of a semiconductor film in the case of using pulsed laser is generally the same or substantially the same as the pulse width of a laser beam. Thus, when the pulse width is equal to or more than 50 psec, crystal defects of about 2 nm in diameter and the surface unevenness with a difference in height of about 1.5 nm can be repaired. In a manner similar to the above, when the pulse width is equal to or more than 700 psec, rearrangement (re-single-crystallization) of the silicon atoms is possible. That is, in order to realize reduction of the crystal defect and the surface unevenness and rearrangement (re-single-crystallization) of the silicon atoms, a pulsed laser with a pulse width of equal to or more than 700 psec may be used. In this embodiment mode, a laser beam with a pulse width of 25 nsec, for example, is used.

When a laser beam is delivered, the single crystal semiconductor layer 112 fixed to the semiconductor substrate 111 may be heated, whereby the temperature of the single crystal semiconductor layer 112 can be increased. The heating temperature is preferably equal to or higher than 400° C. and equal to or lower than 670° C., more preferably, equal to or higher than 450° C. and equal to or lower than 650° C.

Before the single crystal semiconductor layer 112 is irradiated with a laser beam, it is preferable that an oxide film, such as a native oxide film, which is formed on the surface of the single crystal semiconductor layer 112, be removed. Even if irradiation with a laser beam is performed in the state that the oxide film remains on the surface of the single crystal semiconductor layer 112, a sufficient planarization effect cannot be obtained. For the treatment for removing the oxide film, the single crystal semiconductor layer 112 is processed with hydrofluoric acid. It is desirable that the hydrofluoric acid treatment be performed until a surface of the single crystal semiconductor layer 112 shows repellency. When the single crystal semiconductor layer 112 has water repellency, it can be confirmed that the oxide film is removed from the single crystal semiconductor layer 112.

In addition, it is preferable that the single crystal semiconductor layer 112 be etched and the embrittlement region 103 that remains on the separation plane of the single crystal semiconductor layer 112 be removed before the single crystal semiconductor layer 112 is irradiated with a laser beam. By removal of the embrittlement region 103, a surface planarization effect and a crystallinity recovery effect produced by laser irradiation can be enhanced.

This etching can be performed by using dry etching process or wet etching process. Examples of etching gases that can be used in the dry etching process include: chloride gases such as boron chloride, silicon chloride, and carbon tetrachloride; a chlorine gas; fluoride gases such as sulfur fluoride and nitrogen fluoride; an oxygen gas; and the like. In the wet etching process, a tetramethylammonium hydroxide (abbreviation: TMAH) solution or the like can be used as an etchant.

After the laser irradiation, planarization treatment may be further performed on the single crystal semiconductor layer 112. Any one of CMP, dry etching process, and wet etching process or a plurality of these methods can be combined as planarization treatment. Note that since the single crystal semiconductor layer 112 has been irradiated with the laser beam to planarize the surface before this planarization treatment, the amount of grinding can be reduced, compared with the case where CMP or etching is applied without laser irradiation. Therefore, it is not necessary to set the thickness of the single crystal semiconductor layer in consideration of the decrease in thickness due to grinding; accordingly, a thin single crystal semiconductor layer separated from a single crystal semiconductor substrate by one time separation can be obtained, and the single crystal semiconductor substrate can be saved.

In addition, by this planarization treatment, the single crystal semiconductor layer 112 may be thinned to a desired thickness. The thickness of the single crystal semiconductor layer 112 can be determined in accordance with characteristics of an element to be formed with the single crystal semiconductor layer 112. When an active layer or gate insulating layer of a semiconductor element is thinned, improvement in mobility, improvement in subthreshold swing (S value), and suppression of a short channel effect can be achieved. In order to form a thin gate insulating layer with excellent step coverage over the surface of the single crystal semiconductor layer 112 which is bonded to the semiconductor substrate 111, the thickness of the single crystal semiconductor layer 112 is preferably equal to or less than 50 nm and may be equal to or more than 5 nm and equal to or less than 50 nm.

By the step illustrated in FIG. 1E, the crystal defect of the single crystal semiconductor layer 112 can be repaired, and planarity can be improved. However, by laser irradiation, impurities in the atmosphere might be mixed into the single crystal semiconductor layer 112. In addition, when planarization treatment is performed by CMP or etching, there is the case where an abrasive of CMP, etchant, or the like remains on the surface of the single crystal semiconductor layer 112. Thus, to remove these impurities in the single crystal semiconductor layer 112 or the surface thereof, thermal oxidation treatment (also referred to as second thermal oxidation treatment) is performed on the semiconductor substrate 111, whereby an oxide film 113 (also referred to as a second oxide film) is formed (FIG. 1F). The thermal oxidation treatment on the semiconductor substrate 111 can be performed in a similar manner to the first thermal oxidation treatment illustrated in FIG. 1A.

The thermal oxidation treatment is performed at a temperature of from 900° C. to 1150° C. By performing heat treatment in such a temperature range, an effect of removing impurities of the single crystal semiconductor layer 112 can be obtained. Therefore, even when there is an impurity in the single crystal semiconductor layer 112, the impurity is turned into a volatile chloride, moved into the air, and removed by the action of halogen. In addition, halogen is contained in the oxide film 113 at a concentration of $1\times10^{16}$ atoms/cm$^3$ to $5\times10^{21}$ atoms/cm$^3$, whereby the oxide film 113 can function as a protective film which captures impurities that exist in the single crystal semiconductor layer 112 or on the surface thereof and which prevents contamination of the single crystal semiconductor layer 112.

By the step illustrated in FIG. 1F, even when impurities are mixed into the single crystal semiconductor layer 112 in a laser irradiation step or a planarized step, the impurities can be removed or decreased. In addition, by the ion doping step illustrated in FIG. 1B, even if impurities such as metals are mixed into the single crystal semiconductor layer 112, the metal can be removed or decreased.

Next, the oxide film 113 is removed (FIG. 1G). There is no particular limitation on a method for removing the oxide film 113 as long as a method by which the oxide film 113 can be removed is used; for example, buffered hydrofluoric acid or other hydrofluoric acid based etchants can be used.

Through the above steps, an SOI substrate 114 can be manufactured, in which the single crystal semiconductor layer 112 is provided over the semiconductor substrate 111 with the oxide film 102 interposed therebetween. By using the manufacturing method described in this embodiment mode, the SOI substrate 114 having the single crystal semiconductor layer 112 in which crystal defects and impurity concentration are reduced and which has good planarity can be provided. By using this SOI substrate, a semiconductor element having excellent characteristics can be formed.

Figure 5:
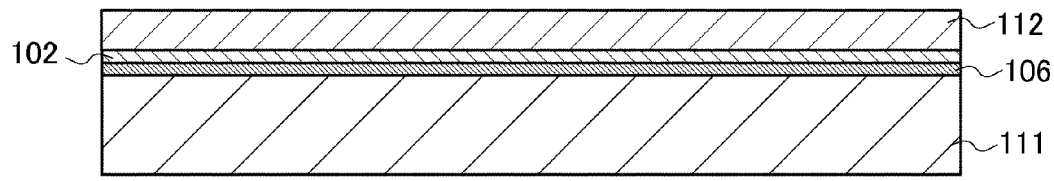
FIG. 5 illustrates an example of a structure of an SOI substrate.
Figure 6:
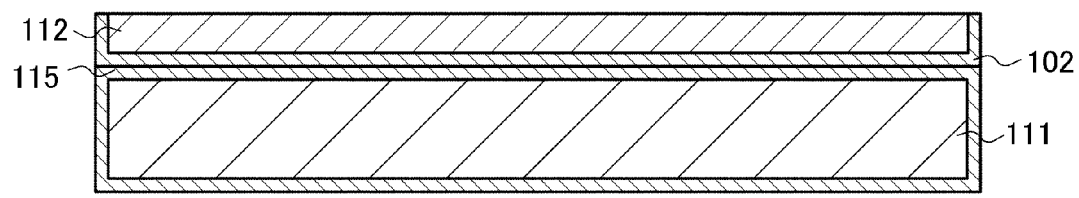
FIG. 6 illustrates an example of a structure of an SOI substrate.
Figure 7:
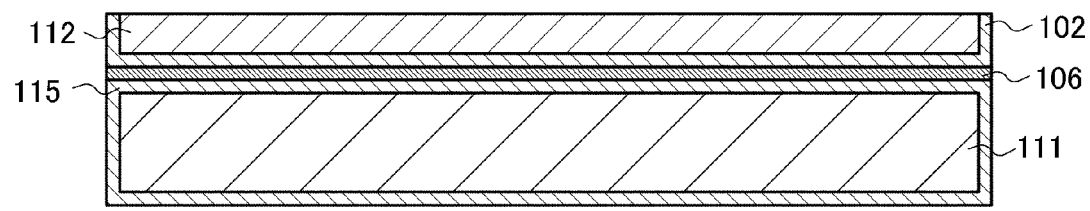
FIG. 7 illustrates an example of a structure of an SOI substrate.

This embodiment mode is not limited to the structure illustrated in FIGS. 1A to 1G, and the structures illustrated in FIG. 5, FIG. 6, and FIG. 7 may be used, for example. A structure is illustrated in FIG. 5 in which the single crystal semiconductor layer 112 is provided over the semiconductor substrate 111 with an insulating film 106 and the oxide film 102 interposed therebetween. The insulating film 106 can be formed using a material such as silicon oxide, silicon oxynitride, silicon nitride, or silicon nitride oxide, which has an oxidizing property over the semiconductor substrate 111. The insulating film 106 may be a film which employs a single insulating film or films in which a plurality of insulating films are stacked.

For example, in the case of using silicon oxide as the insulating film 106, the insulating film 106 can be formed using a mixed gas of silane and oxygen, a mixed gas of tetraethoxysilane (TEOS) and oxygen, or the like by a vapor deposition method such as thermal CVD, plasma CVD, atmospheric pressure CVD, or bias ECRCVD. The thickness of the insulating film 106 can be from 10 nm to 1000 nm (preferably, from 50 nm to 300 nm). A surface of the insulating film 106 may be subjected to oxygen plasma treatment to increase the density. In the case of using silicon nitride for the insulating film 106, the insulating film 106 can be formed using a mixed gas of silane and ammonia by a vapor deposition method such as plasma CVD. In addition, in the case of using a silicon nitride oxide film for the insulating film 106, the insulating film 106 can be formed using a mixed gas of silane and ammonium or a mixed gas of silane and nitrogen oxide by a vapor deposition method such as plasma CVD.

As the insulating film 106, silicon oxide may be formed using an organosilane gas by a chemical vapor deposition method. As the organosilane gas, a silicon-containing compound such as tetraethoxysilane (TEOS: chemical formula, $Si(OC_2H_5)_4$), tetramethylsilane (TMS: chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

In this specification, the oxynitride refers to a substance which contains more oxygen atoms than nitrogen atoms; whereas the nitride oxide refers to a substance which contains more nitrogen atoms than oxygen atoms. Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

After the insulating film 106 is formed over the semiconductor substrate 111, the oxide film 102 is formed on the surface, and the single crystal semiconductor substrate 101 (see FIGS. 1A and 1B) provided with the embrittlement region 103 in a region at a predetermined depth from the surface and the semiconductor substrate 111 are bonded to each other with the oxide film 102 and the insulating film 106 interposed therebetween. Next, heat treatment is performed and separation is conducted at the embrittlement region 103, whereby the single crystal semiconductor layer 112 can be formed over the semiconductor substrate 111 with the insulating film 106 and the oxide film 102 interposed therebetween. In addition, the single crystal semiconductor layer 112 after the separation is subjected to laser irradiation and thermal oxidation treatment, whereby crystallinity and planarity are improved, and impurity concentration is reduced. Note that planarization treatment may be further performed on the single crystal semiconductor layer 112. As these methods, the method illustrated in FIGS. 1E, 1F, and 1G may be used, and detailed description is omitted.

By the above steps, the SOI substrate illustrated in FIG. 5 can be manufactured. Note that the example in which the insulating film 106 is provided on the semiconductor substrate 111 side is described; however, the present invention is not limited thereto, and the insulating film 106 can be provided on the single crystal semiconductor substrate 101 side. In that case, the insulating film 106 can be formed over the oxide film 102 formed on the surface of the single crystal semiconductor substrate 101.

An oxide film obtained by thermal oxidation treatment has smoothness; therefore, when the insulating film 106 is formed over the oxide film, the smoothness of the insulating film 106 can be improved. Thus, bonding between the single crystal semiconductor substrate and the semiconductor substrate can be performed well. In addition, when the insulating film 106 is formed on the semiconductor substrate 111 side, the insulating film 106 can function as a planarizing film even if there is unevenness on the surface of the semiconductor substrate 111. Thus, bonding between the single crystal semiconductor substrate and the semiconductor substrate can be performed well.

A structure is illustrated in FIG. 6 in which the single crystal semiconductor layer 112 is provided over the semiconductor substrate 111 with an oxide film 115 and the oxide film 102 interposed therebetween. The oxide film 115 can be formed by performing thermal oxidation treatment on the semiconductor substrate 111, in a similar manner to the oxide film 102. Thermal oxidation treatment may be performed by dry oxidation; however, it is preferable that oxidation be performed in an oxidizing atmosphere to which halogen is added. As a gas for adding halogen to an oxidizing atmosphere, one or more kinds selected from HCl, HF, $NF_3$, HBr, $Cl_2$, dichloroethene (DCE), $ClF_3$, $BCl_3$, $F_2$, $Br_2$, or the like can be used. The oxide film 115 has a thickness of 10 nm to 1000 nm (preferably, 50 nm to 300 nm).

As for the oxide film 115 formed on the surface of the semiconductor substrate 111 in this manner, impurities such as metal are fixed in the oxide film 115 by action of halogen contained in an oxidizing atmosphere, and the concentration of impurities such as metal in the semiconductor substrate 111 is reduced.

After the oxide film 115 is formed on the surface of the semiconductor substrate 111, the oxide film 102 is formed on the surface, and the single crystal semiconductor substrate 101 (see FIGS. 1A and 1B) provided with the embrittlement region 103 in a region at a predetermined depth from the surface and the semiconductor substrate 111 are bonded to each other with the oxide film 102 and the oxide film 115 interposed therebetween. Next, heat treatment is performed and separation is conducted at the embrittlement region 103, whereby the single crystal semiconductor layer 112 can be formed over the semiconductor substrate 111 with the oxide film 115 and the oxide film 102 interposed therebetween. In addition, the single crystal semiconductor layer 112 after the separation is subjected to laser irradiation and thermal oxidation treatment, whereby crystallinity and planarity are improved, and impurity concentration is reduced. Note that planarization treatment may be performed on the single crystal semiconductor layer 112. As these methods, the method illustrated in FIGS. 1E, 1F, and 1G may be used, and detailed description is omitted. By the above steps, the SOI substrate illustrated in FIG. 6 can be manufactured.

The oxide film is formed by thermal oxidation treatment on each surface of the single crystal semiconductor substrate and the semiconductor substrate 111, whereby the oxide film serves as a blocking layer that prevents contamination of the single crystal semiconductor layer 112 by diffusion of impurities to the single crystal semiconductor layer 112 from the semiconductor substrate 111. Since the oxide film obtained by thermal oxidation treatment has smoothness, bonding between the single crystal semiconductor substrate and the semiconductor substrate can be performed well.

A structure is illustrated in FIG. 7 in which the single crystal semiconductor layer 112 is provided over the semiconductor substrate 111 with the oxide film 115, the insulating film 106, and the oxide film 102 interposed therebetween. The oxide film 115 and the insulating film 106 can be formed by the above method. Note that the insulating film 106 can be provided for either the single crystal semiconductor substrate 101 or the semiconductor substrate 111 or for both of these.

The oxide film 115 is formed over the semiconductor substrate 111, and the insulating film 106 is formed over the oxide film 115. Then, the oxide film 102 is formed in a manner similar to the step illustrated in FIG. 1C, and bonding to the single crystal semiconductor substrate 101 provided with the embrittlement region 103 is performed. Then, the SOI substrate illustrated in FIG. 7 can be formed in similar steps illustrated in FIGS. 1D to 1G.

The oxide film is formed by thermal oxidation treatment on each surface of the single crystal semiconductor substrate 101 and the semiconductor substrate 111, whereby the oxide film serves as a blocking layer that prevents contamination of the single crystal semiconductor layer 112 by diffusion of impurities to the single crystal semiconductor layer 112 from the semiconductor substrate 111. Since the oxide film obtained by thermal oxidation treatment has smoothness, the insulating film 106 is formed over the oxide film, whereby smoothness of the insulating film 106 can be improved. Furthermore, the insulating film 106 is formed, whereby unevenness on the surface of the single crystal semiconductor substrate 101 or the semiconductor substrate 111 can be reduced to have a flat surface. Accordingly, bonding between the single crystal semiconductor substrate and the semiconductor substrate can be performed well.

Note that in this embodiment mode, as a method for forming the oxide film 115 containing chlorine atoms, the case is described in which thermal oxidation treatment is performed in an oxidizing atmosphere which contains hydrogen chloride or dichloroethylene; however, the implementation of the present invention is not limited thereto. For example, thermal oxidation treatment may be performed on the semiconductor substrate 111 in an oxidizing atmosphere and the oxide film 115 (e.g., $SiO_x$) may be formed on the surface of the semiconductor substrate 111; then, chlorine ions accelerated by an electric field may be added by using an ion doping apparatus or an ion implanter whereby the oxide film 115 may contain chlorine atoms. In addition, after the surface is processed with a hydrogen chloride (HCl) solution, thermal oxidation treatment may be performed in an oxidizing atmosphere.

The method for manufacturing an SOI substrate described in this embodiment mode can be combined with manufacturing methods in other embodiment modes in this specification, as appropriate.

An ion irradiation method, which is one aspect of the present invention, is considered below.

In this embodiment mode, a single crystal semiconductor substrate is irradiated with ions that are derived from hydrogen (H) (hereinafter referred to as "hydrogen ion species"). More specifically, a hydrogen gas or a gas which contains hydrogen in its composition is used as a source material; hydrogen plasma is generated; and a single crystal semiconductor substrate is irradiated with the hydrogen ion species in the hydrogen plasma.

(Ions in Hydrogen Plasma)

In such hydrogen plasma as described above, hydrogen ion species such as $H^+$, $H_2^+$, and $H_3^+$ are present. Here are listed reaction equations for reaction processes (formation processes, annihilation processes) of the hydrogen ion species.

$$e + H \rightarrow e + H^+ + e \quad (1)$$

$$e + H_2 \rightarrow e + H_2^+ + e \quad (2)$$

$$e + H_2 \rightarrow e + (H_2)^* \rightarrow e + H + H \quad (3)$$

$$e + H_2^+ \rightarrow e + (H_2^+)^* \rightarrow e + H^+ + H \quad (4)$$

$$H_2^+ + H_2 \rightarrow H_3^+ + H \quad (5)$$

$$H_2^+ + H_2 \rightarrow H^+ + H + H_2 \quad (6)$$

$$e + H_3^+ \rightarrow e + H^+ + H + H \quad (7)$$

$$e + H_3^+ \rightarrow H_2 + H \quad (8)$$

$$e + H_3^+ \rightarrow H + H + H \quad (9)$$

Figure 8:
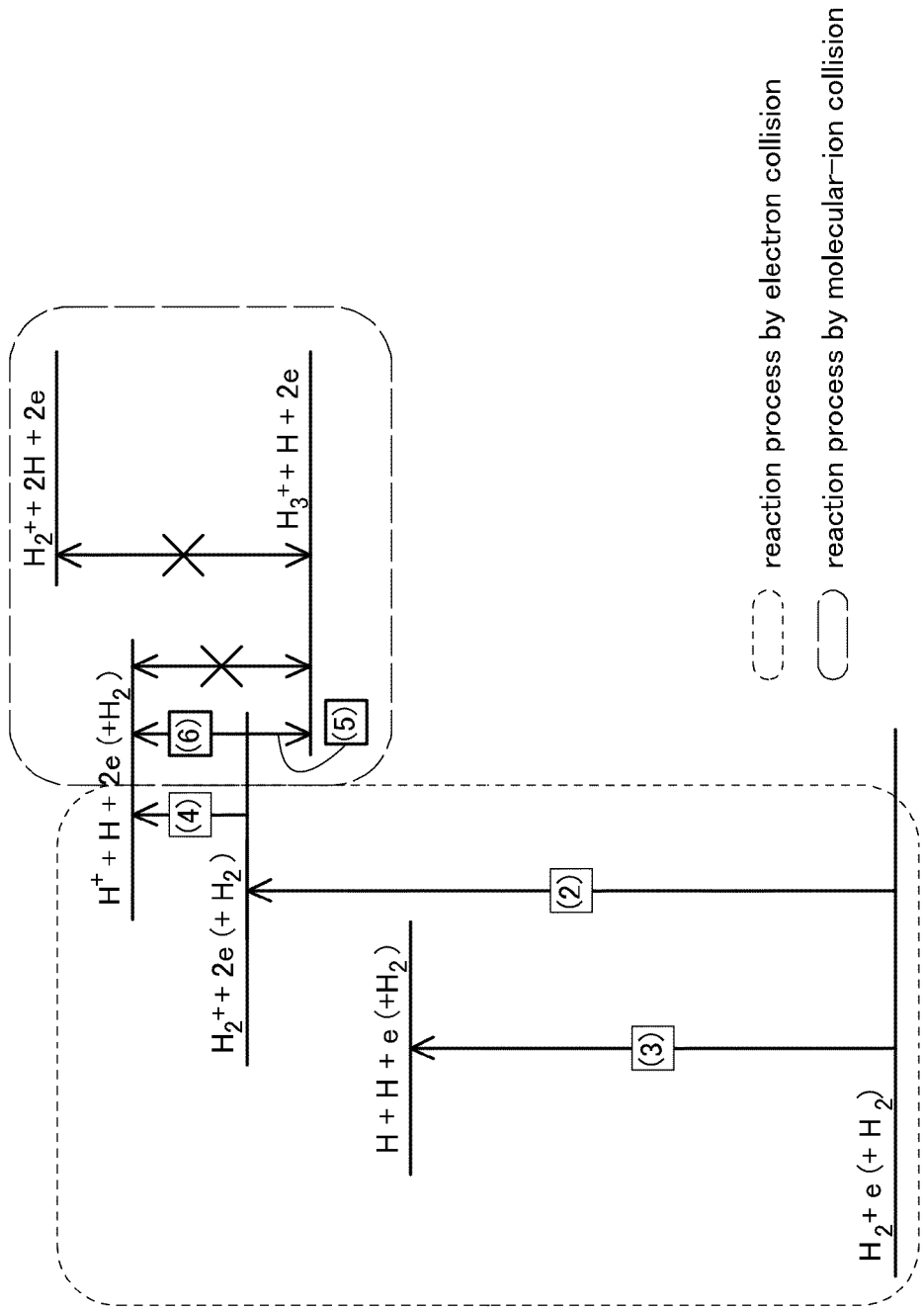
FIG. 8 is an energy diagram of hydrogen ion species.

FIG. 8 is an energy diagram which schematically illustrates some of the above reactions. Note that the energy diagram illustrated in FIG. 8 is merely a schematic diagram and does not depict the relationships of energies of the reactions exactly. Note that the following reaction equations are not observed experimentally; therefore, the reaction equations are illustrated with crosses in FIG. 8.

$$H_2 + H^+ \rightarrow H_3^+ \quad (10)$$

$$H_2^+ + H \rightarrow H_3^+ \quad (11)$$

($H_3^+$ Formation Process)

As described above, $H_3^+$ is mainly generated through the reaction process that is represented by the reaction equation (5). On the other hand, as a reaction that competes with the reaction equation (5), there is the reaction process represented by the reaction equation (6). For the amount of $H_3^+$ to increase, at the least, it is necessary that the reaction of the reaction equation (5) occur more often than the reaction of the reaction equation (6) (note that, because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy a given charged particle gains before colliding with another particle is equal to the difference between potential energy at a potential before the charged particle moves and potential energy at a potential before the collision. That is, in a situation where a charged particle can transfer a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in a situation where the electric field is low, the amount of $H_3^+$ tends to be increased.

(Differences Depending on Ion Source)

Figure 9:
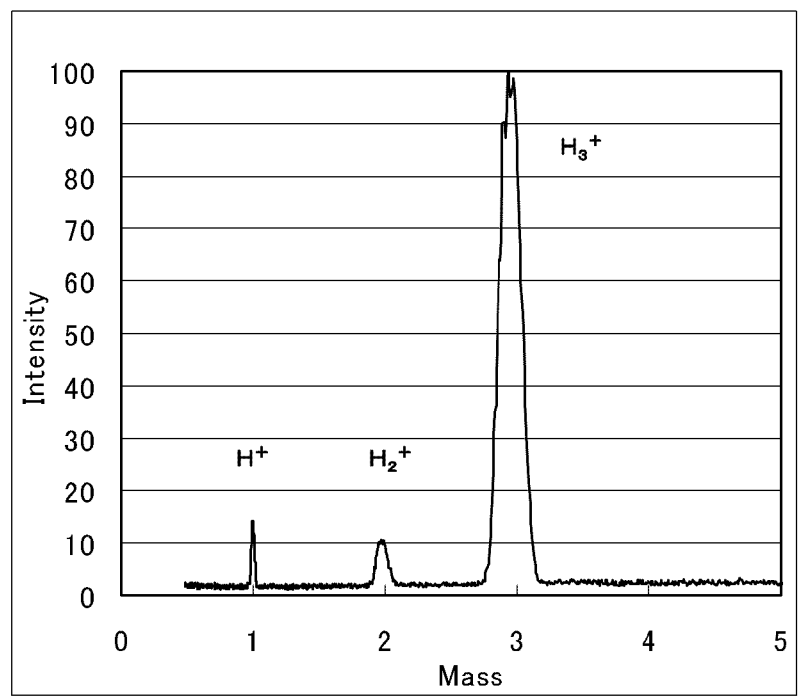
FIG. 9 is a diagram illustrating the results of ion mass spectrometry.

Here, an example in which the proportions of ion species (particularly, the proportion of $H_3^+$) are different is described. FIG. 9 is a graph illustrating the results of mass spectrometry of ions that are generated from a 100% hydrogen gas (with the pressure of an ion source of $4.7\times10^{-2}$ Pa). Note that this mass spectrometry was performed by measurement of ions that were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 9, the number of ions with different masses is expressed as a relative proportion where the number of ions with a mass of 3 is defined as 100. It can be seen from FIG. 9 that the ratio between ion species that are generated from the ion source, i.e., the ratio between $H^+$, $H_2^+$, and $H_3^+$, is about 1:1:8. Note that ions at such a ratio can also be generated by an ion doping apparatus which has a plasma source portion (ion source) that generates plasma, an extraction electrode that extracts an ion beam from the plasma, and the like.

Figure 10:
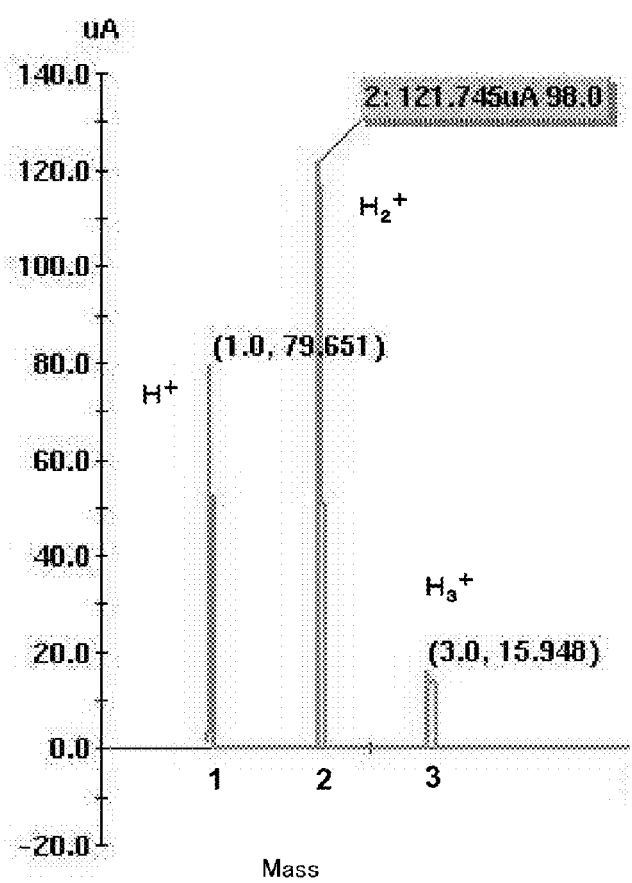
FIG. 10 is a diagram illustrating the results of ion mass spectrometry.

FIG. 10 is a graph illustrating the results of mass spectrometry of ions that are generated from $PH_3$ when an ion source different from that for the case of FIG. 9 is used and the pressure of the ion source is about $3\times10^{-3}$ Pa. The results of this mass spectrometry focus on the hydrogen ion species. In addition, the mass spectrometry was performed by measurement of ions that were extracted from the ion source. In FIG. 10, as in FIG. 9, the horizontal axis represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 10 that the ratio between ion species in plasma, i.e., the ratio between $H^+$, $H_2^+$, and $H_3^+$, is about 37:56:7. Note that, although FIG. 10 illustrates the data obtained when the source gas is $PH_3$, the ratio between the hydrogen ion species is about the same when a 100% hydrogen gas is used as a source gas, as well.

In the case of the ion source from which the data illustrated in FIG. 10 is obtained, $H_3^+$, of $H^+$, $H_2^+$, and $H_3^+$, is generated at a proportion of only about 7%. On the other hand, in the case of the ion source from which the data illustrated in FIG. 9 is obtained, the proportion of $H_3^+$ ions can be set to be higher than or equal to 50% (under the aforementioned conditions, about 80%). This is thought to result from the pressure and electric field inside a chamber, which is clearly shown in the above consideration.

($H_3^+$ Irradiation Mechanism)

When plasma that contains a plurality of ion species as illustrated in FIG. 9 is generated and a single crystal semiconductor substrate is irradiated with the generated ion species without any mass separation being performed, the surface of the single crystal semiconductor substrate is irradiated with each of $H^+$, $H_2^+$, and $H_3^+$ ions. In order to reproduce the mechanism, from the irradiation with ions to the formation of an ion-introduced region, the following five types of models are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

(Comparison of Simulation Results with Measured Values)

Based on the above models, the irradiation of an Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that, for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H^+$ that has half the kinetic energy, and a calculation based on Model 5, with the $H_3^+$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of an Si substrate changes into a non-single-crystal structure due to the collision of the hydrogen ion species with Si atoms.

Figure 11:
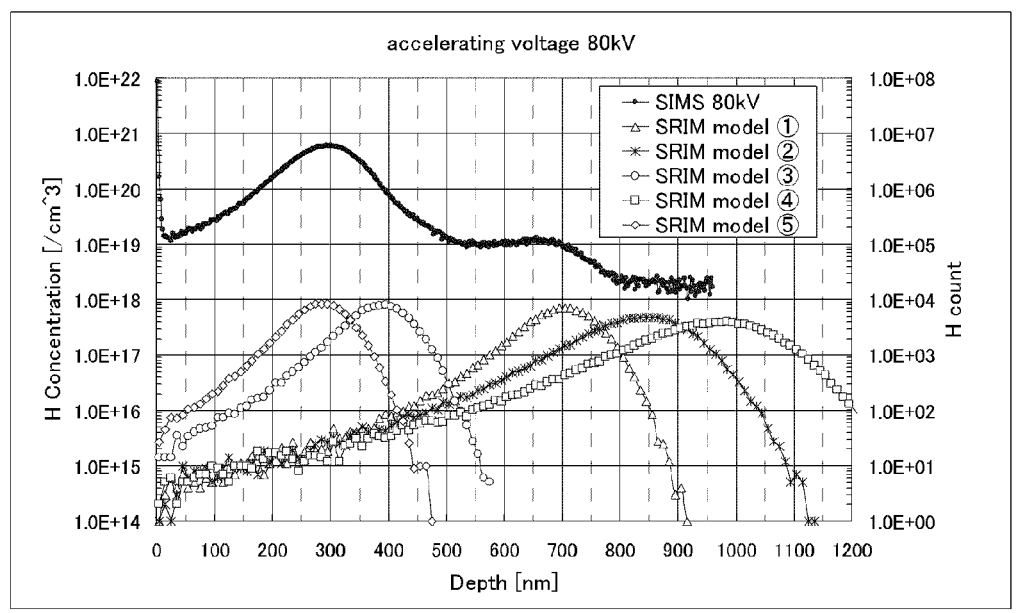
FIG. 11 is a diagram illustrating the profile (measured values and calculated values) of hydrogen in the depth direction when the accelerating voltage is 80 kV.

FIG. 11 illustrates the calculation results of the number of hydrogen atoms in a silicon substrate, obtained when the silicon substrate is irradiated with the hydrogen ion species (irradiation with 100,000 atoms for H) using Models 1 to 5. FIG. 11 also illustrates the hydrogen concentration (secondary ion mass spectrometry (SIMS) data) in an Si substrate irradiated with the hydrogen ion species of FIG. 9. The results of calculations performed using Models 1 to 5 are expressed on the vertical axis (right axis) as the number of hydrogen atoms, and the SIMS data is expressed on the vertical axis (left axis) as the density of hydrogen atoms. The horizontal axis represents depth from the surface of an Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is approximately several kiloelectron volts whereas the H—H bond energy is only approximately several electron volts, it is thought that the contribution of each of Models 2 and 4 is small because $H_2^+$ and $H_3^+$ mostly split into $H^+$ or H by colliding with Si atoms.

Figure 12:
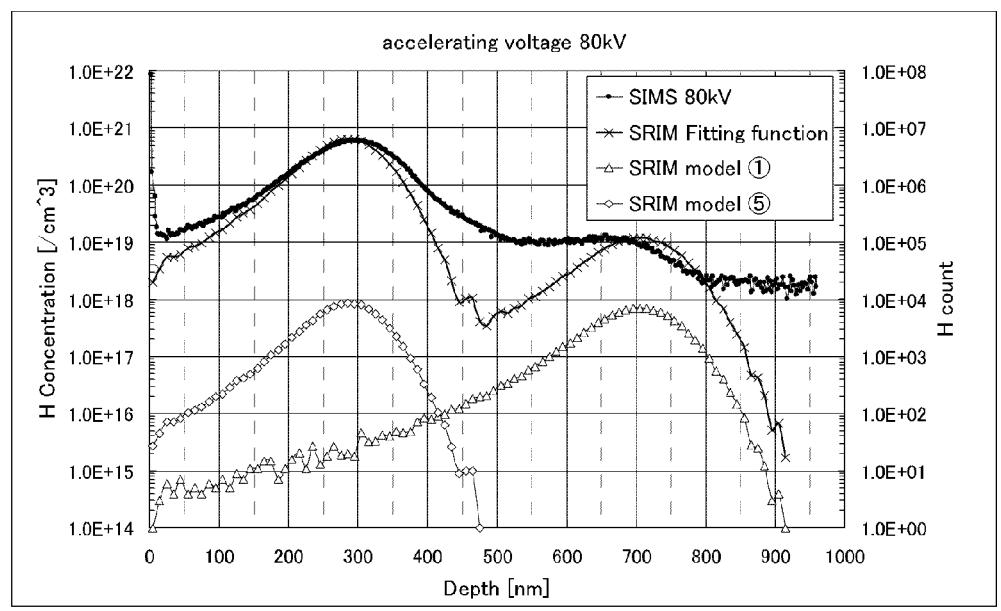
FIG. 12 is a diagram illustrating the profile (measured values, calculated values, and fitting functions) of hydrogen in the depth direction when the accelerating voltage is 80 kV.
Figure 13:
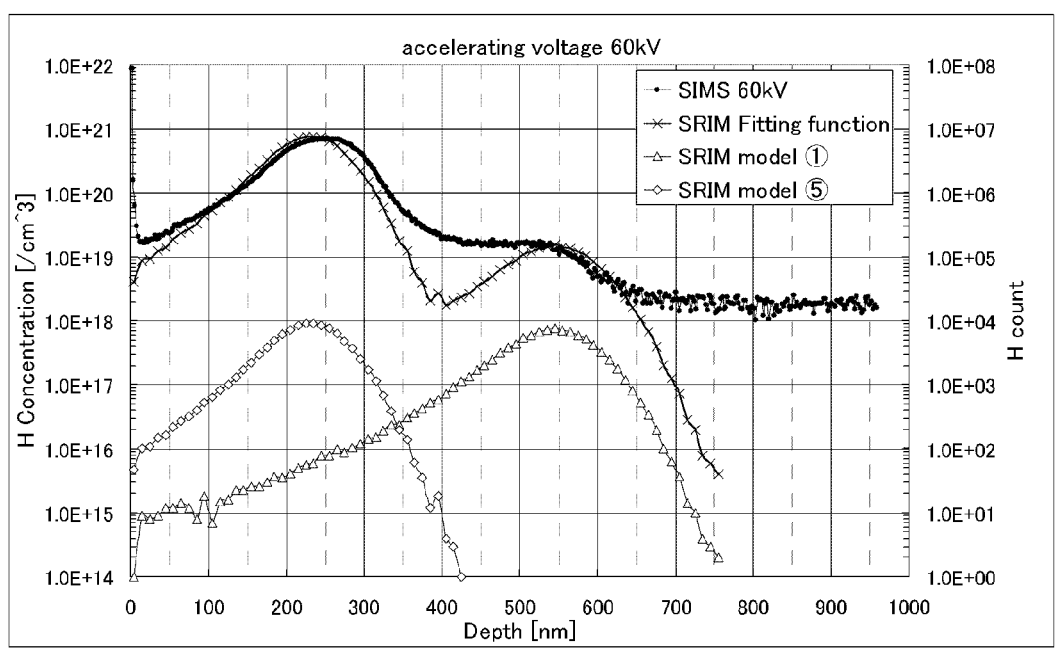
FIG. 13 is a diagram illustrating the profile (measured values, calculated values, and fitting functions) of hydrogen in the depth direction when the accelerating voltage is 60 kV.
Figure 14:
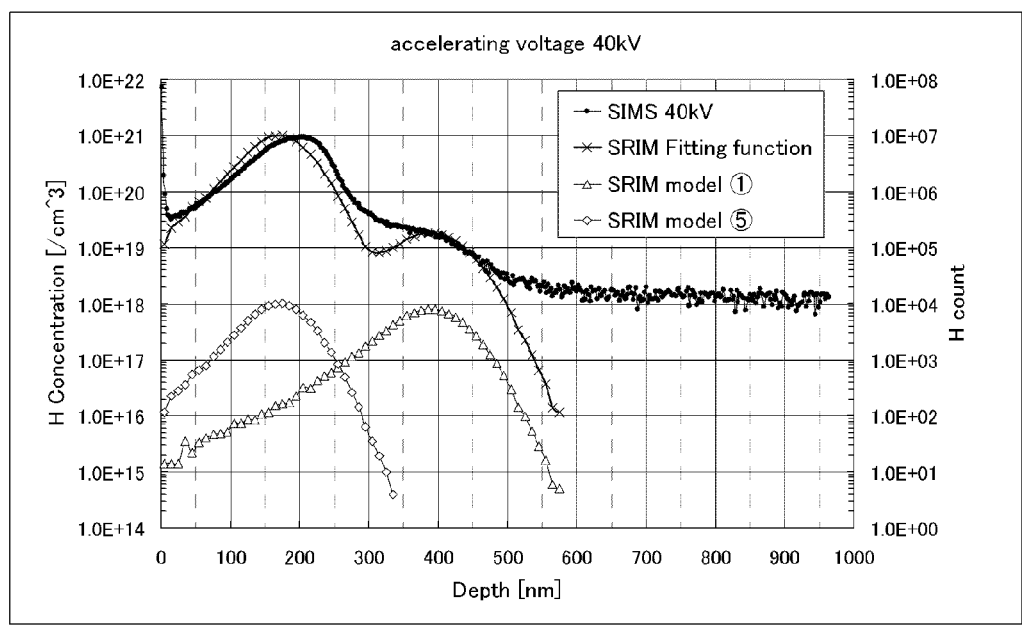
FIG. 14 is a diagram illustrating the profile (measured values, calculated values, and fitting functions) of hydrogen in the depth direction when the accelerating voltage is 40 kV.

Accordingly, Models 2 to 4 will not be considered hereinafter. FIG. 12, FIG. 13, and FIG. 14 each illustrate the calculation results obtained when irradiation with the hydrogen ion species (irradiation with 100,000 atoms for H) is performed using Models 1 and 5. FIG. 12, FIG. 13, and FIG. 14 also each illustrate the hydrogen concentration (SIMS data) in an Si substrate irradiated with the hydrogen ion species of FIG. 9, and the simulation results fitted to the SIMS data (hereinafter referred to as a fitting function). Here, FIG. 12 illustrates the case where the accelerating voltage is 80 kV; FIG. 13, the case where the accelerating voltage is 60 kV; and FIG. 14, the case where the accelerating voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of an Si substrate.

The fitting function is obtained using the calculation formula given below, in consideration of Models 1 and 5. Note that, in the calculation formula, X and Y represent parameters for fitting and V represents volume.

(Fitting Function)=$X/V$×(Data of Model 1)+$Y/V$×(Data of Model 5).

In consideration of the ratio between ion species used for actual irradiation ($H^+:H_2^+:H_3^+$ is about 1:1:8), the contribution of $H_2^+$ (i.e., Model 3) should also be considered; however, Model 3 is excluded from the consideration given here for the following reasons.

Because the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous Si and the influence due to crystallinity is not considered.

FIG. 15 lists the aforementioned fitting parameters. At any of the accelerating voltages, the ratio of the amount of H introduced according to Model 1 to that introduced according to Model 5 is about 1:42 to 1:45 (the amount of H in Model 5, when the amount of H in Model 1 is defined as 1, is equal to or more than about 42 and equal to or less than about 45), and the ratio of the number of ions used for irradiation, $H^+$ (Model 1) to that of $H_3^+$ (Model 5) is about 1:14 to 1:15 (the amount of $H_3^+$ in Model 5, when the amount of $H^+$ in Model 1 is defined as 1, is equal to or more than about 14 and equal to or less than about 15). Considering that Model 3 is not considered and the calculation assumes amorphous Si, it can be said that values close to that of the ratio between ion species used for actual irradiation ($H^+:H_2^+:H_3^+$ is about 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$ as illustrated in FIG. 9. For example, because $H_3^+$ splits into $H^+$, H, or the like to be introduced into a substrate, ion introduction efficiency can be improved compared with the case of irradiation mainly with $H^+$ or $H_2^+$. This leads to an improvement in productivity of semiconductor substrates. In addition, because the kinetic energy of $H^+$ or H after $H_3^+$ splits similarly tends to be low, $H_3^+$ is suitable for manufacture of thin semiconductor layers.

Note that, in this specification, a method is described in which an ion doping apparatus that is capable of irradiation with the hydrogen ion species as illustrated in FIG. 9 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in productivity can be obtained. On the other hand, if first priority is given to irradiation with $H_3^+$, there is no need to interpret this embodiment mode as being limited to the use of an ion doping apparatus.

Embodiment Mode 2

This embodiment mode describes a method for manufacturing an SOI substrate, which is different from that in the above embodiment mode, with reference to drawings. Specifically, a case is described in which an SOI substrate is manufactured using a single crystal semiconductor substrate which has rounded corners (end portions) (with edge roll-off (ERO)). In addition, a case is described in which the single crystal semiconductor substrate is repeatedly used (reused) with reference to drawings.

Figure 16A:
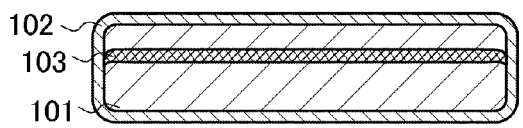
FIGS. 16A to 16I illustrate an example of a method for manufacturing an SOI substrate.

First, the single crystal semiconductor substrate 101 (here, a single crystal silicon substrate) which has the oxide film 102 on its surface and the embrittlement region 103 in a region at a predetermined depth from its surface is prepared (see FIG. 16A). The detailed description of FIG. 16A is omitted because the method illustrated in FIGS. 1A and 1B may be employed.

In this embodiment mode, corners (end portions) of the single crystal semiconductor substrate 101 each have a round shape; thus, the oxide film 102 is formed on the surfaces of the end portions, as illustrated in FIG. 16A.

Figure 16B:
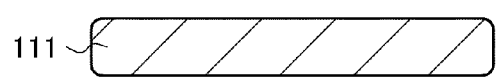
Figure 16C:
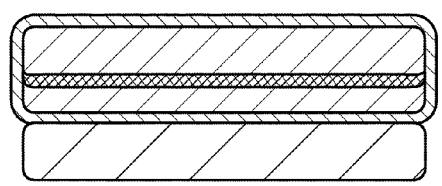

Next, the semiconductor substrate 111 is prepared (FIG. 16B), and bonding is performed so that the oxide film 102 and one surface of the semiconductor substrate 111 face each other (FIG. 16C).

Figure 16D:
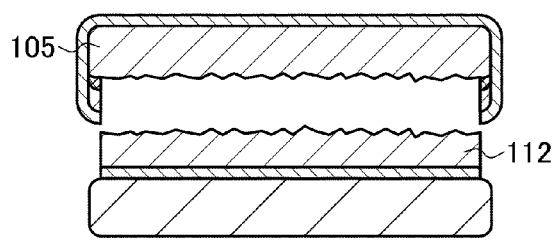

Then, heat treatment is performed and separation is conducted at the embrittlement region 103, whereby the single crystal semiconductor layer 112 is formed over the semiconductor substrate 111 with the oxide film 102 interposed therebetween (FIG. 16D).

Figure 16F:
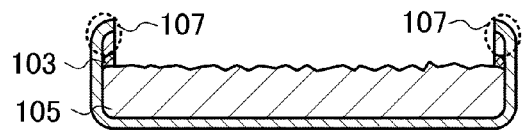
Figure 16E:
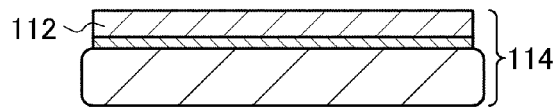

Through the above-described steps, the single crystal semiconductor layer 112 can be formed over the semiconductor substrate 111 with the oxide film 102 interposed therebetween. In addition, the single crystal semiconductor layer 112 after separation is subjected to laser irradiation and thermal oxidation treatment by the method illustrated in FIGS. 1E to 1G Therefore, the SOI substrate 114 having the single crystal semiconductor layer 112 in which crystallinity and planarity are improved and impurity concentration is reduced can be formed (FIG. 16E).

The detailed description of FIGS. 16A to 16E is omitted because a method similar to the method described in Embodiment Mode 1 may be employed.

Next, steps of repeatedly using the separated single crystal semiconductor substrate 105 (treatment for reprocessing a semiconductor substrate) are described.

The separated single crystal semiconductor substrate 105 is not sufficiently bonded to the semiconductor substrate 111 at the end portions of the single crystal semiconductor substrate 101 due to the influence of edge roll-off in some cases. As a result, the end portions of the single crystal semiconductor substrate 105 are not separated at the embrittlement region 103, and the oxide film 102 or the like is left in some cases (FIG. 16F).

Figure 16G:

Next, residual portions 107 at the end portions of the semiconductor substrate 105 are removed (see FIG. 16G). The residual portions 107 can be removed by performing wet etching. Specifically, wet etching is performed using a mixture containing hydrofluoric acid, ammonium fluoride, and a surfactant as an etchant (e.g., product name: LAL 500 manufactured by STELLA CHEMIFA CORPORATION).

Moreover, the embrittlement region 103 into which hydrogen ions are introduced can be removed by wet etching using an organic alkaline aqueous solution typified by tetramethylammonium hydroxide (TMAH). Through such treatment, steps due to the residues in the end portions of the single crystal semiconductor substrate 105 can be suppressed.

Figure 16H:

Next, by thermally oxidizing the single crystal semiconductor substrate 105, an oxide film 108 is formed (FIG. 16H), and then the oxide film 108 is removed. Note that the thermal oxidation is preferably performed in an atmosphere to which halogen is added. As a material for forming a halogen atmosphere, HCl can be used, for example. By forming the oxide film 108 through such thermal oxidation treatment and then removing the oxide film 108, an effect of removing impurities such as metal can be obtained. That is, when HCL is used, an impurity such as metal is turned into a volatile chloride, moved into the air, and removed by the action of chlorine.

Figure 16I:
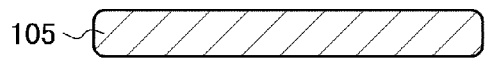
Figure 17A:
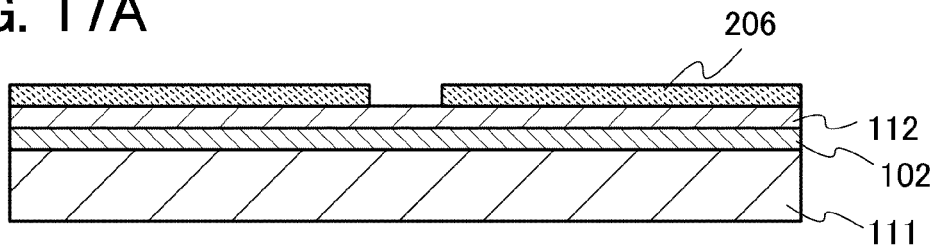
FIGS. 17A to 17E are diagrams illustrating an example of a method for manufacturing a semiconductor device using an SOI substrate.
Figure 17B:
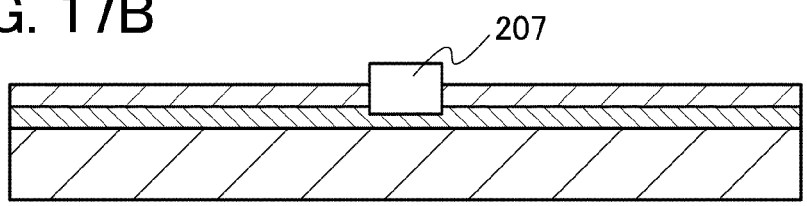
Figure 17C:
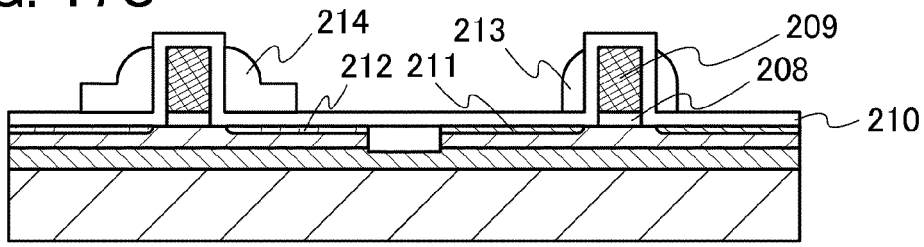
Figure 17D:
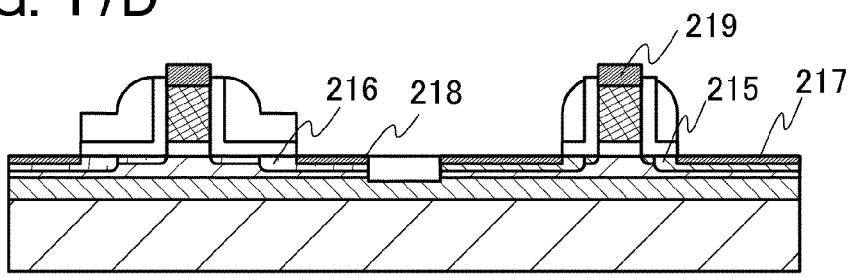
Figure 17E:
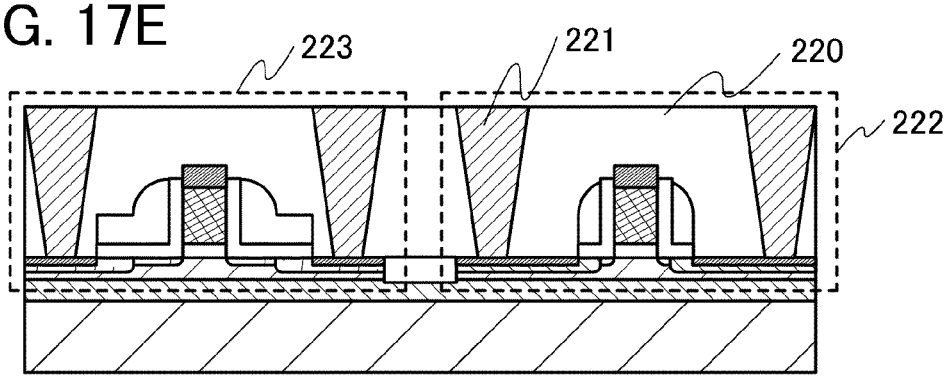

Next, planarization treatment is performed on the single crystal semiconductor substrate (FIG. 16I). The planarization treatment can be performed by any one of CMP, dry etching process, wet etching process, or laser irradiation, or a combination of a plurality of these methods. Planarization is performed by CMP in this embodiment mode. Thus, the steps in the end portions of the single crystal semiconductor substrate 105 are removed, and the surface of the single crystal semiconductor substrate 105 can be planarized. In addition, crystal defects on the surface of the single crystal semiconductor substrate 105 can be reduced by planarization treatment. Then, the obtained single crystal semiconductor substrate 105 can be reused.

The single crystal semiconductor substrate 105 obtained by the above steps can be reused as a single crystal semiconductor substrate in which crystal defects are reduced, crystallinity is high, and planarity is improved. In addition, by repeatedly using a single crystal semiconductor substrate through the steps of reprocessing a single crystal semiconductor substrate, reduction in cost can be realized. Since a reprocessed surface of the single crystal semiconductor substrate described in this embodiment mode can be planarized sufficiently, adhesion between the single crystal semiconductor substrate and the semiconductor substrate can be improved and bonding defects can be reduced.

Note that this embodiment mode can be combined with any of the other embodiment modes.

Embodiment Mode 3

In this embodiment mode, a method for manufacturing the semiconductor device using the SOI substrate formed in Embodiment Mode 1 or Embodiment Mode 2 will be described. Here, an example of manufacturing a CMOS structure as the semiconductor device will be described with reference to FIGS. 17A to 17E. The same portions in FIGS. 17A to 17E as those of FIGS. 1A to 1G, FIGS. 2A and 2B, FIGS. 3A to 3F, FIGS. 4A to 4C, FIG. 5, FIG. 6, FIG. 7, FIG. 8, FIG. 9, FIG. 10, FIG. 11, FIG. 12, FIG. 13, FIG. 14, FIG. 15, and FIGS. 16A to 16I are denoted by the same reference numerals, and will not be further described.

With the use of the manufacturing method described in the above embodiment mode, the single crystal semiconductor layer 112 of the SOI substrate can be formed to a thickness of 100 nm or less. When the single crystal semiconductor layer 112 has a thickness of 100 nm or less, it is thinner than the maximum depth of a depletion layer in a channel formation region of a transistor, and outstanding electrical characteristics of the transistor are brought about. When a sufficient depletion layer is obtained in the channel formation region of the transistor, a subthreshold swing, a threshold voltage, and the like, which are favorable can be obtained. For example, when a CMOS structure can be formed by a complementary combination of an n-channel transistor and a p-channel transistor, high switching speed can be achieved.

First, after an SOI substrate is obtained in accordance with the above embodiment mode, a protective layer 206 serving as a mask for forming an element separation insulating layer is formed over the single crystal semiconductor layer 112. This step is illustrated in a process cross-sectional view of FIG. 17A. As the protective layer 206, a silicon oxide film, a silicon nitride film, or the like is used.

Note that in order to control threshold voltage, a p-type impurity such as boron, aluminum, or gallium is preferably added to the single crystal semiconductor layer 112. For example, boron as a p-type impurity may be added at a concentration within the range of equal to or more than $5\times10^{17}$ $cm^{-3}$ and equal to or less than $1\times10^{18}$ $cm^{-3}$.

Next, etching is performed using the protective layer 206 as a mask, and parts of the exposed single crystal semiconductor layer 112 and the oxide film 102 thereunder are removed. Then, a silicon oxide film is deposited by a chemical vapor deposition method using TEOS. This silicon oxide film is stacked to be thick so that the single crystal semiconductor layer 112 is buried. Next, after a portion of the silicon oxide film superposed over the single crystal semiconductor layer 112 is removed by polishing, the protective layer 206 is removed, whereby an element separation insulating layer 207 is left. This step is illustrated in a process cross-sectional view of FIG. 17B.

Next, a first insulating film is formed, gate electrodes 209 having a polysilicon film that contains a conductive material are formed over the first insulating film, and the first insulating film is etched using the gate electrode as a mask to form a gate insulating layer 208. The gate insulating layer 208 is a single layer of a film containing silicon oxide, silicon nitride oxide, silicon nitride, hafnium oxide, aluminum oxide, or tantalum oxide obtained by using a PECVD method, a sputtering method, or the like; or a stacked layer of these films. The gate insulating layer 208 can be formed to have a small thickness of, for example, 20 nm to cover the surface of the single crystal semiconductor layer 112 by a PECVD method. Alternatively, the gate insulating layer 208 may be formed by oxidizing or nitriding the surface of the single crystal semiconductor layer 112 by high-density plasma treatment. The high-density plasma treatment is performed by using, for example, a mixed gas of a noble gas such as He, Ar, Kr, or Xe, and a gas such as oxygen, nitrogen oxide, ammonia, nitrogen, or hydrogen. In this case, when excitation of the plasma is performed by introduction of a microwave, high density plasma with a low electron temperature can be generated. The surface of the single crystal semiconductor layer 112 is oxidized or nitrided by oxygen radicals (OH radicals may be included) or nitrogen radicals (NH radicals may be included) which are generated by such high-density plasma, whereby an insulating film is formed to a thickness of 1 nm to 50 nm, preferably 5 nm to 30 nm so as to be in contact with the single crystal semiconductor layer 112.

Since crystal defects of the single crystal semiconductor layer formed by the manufacturing method described in the above embodiment mode are reduced, localized state density can be reduced at the interface with the gate insulating layer. In other words, the interface between the single crystal semiconductor layer 112 and the gate insulating layer 208 is inactivated, so that electric characteristics become stable. Since the surface of the single crystal semiconductor layer is sufficiently planarized, even when an insulating film having a thickness of 20 nm is used as the gate insulating layer 208, sufficient gate withstand voltage can be obtained. This step is illustrated in a process cross-sectional view of FIG. 17C.

Subsequently, a second insulating film 210 which covers the gate electrodes 209 is formed. Then, a region to be an nFET (field effect transistor) is doped with phosphorus (P), arsenic (As), or the like to form first impurity regions 211, and a region to be a pFET is doped with boron (B) or the like to form second impurity regions 212. Further, sidewall insulating layers 213 and 214 are formed. The sidewall insulating layers 214 of the region to be a pFET are larger in width than the sidewall insulating layers 213 of the region to be an nFET. This step is illustrated in a process cross-sectional view of FIG. 17C.

Next, the second insulating film 210 is partly etched to expose a top surface of the gate electrodes 209, and surfaces of the first impurity regions 211 and the second impurity regions 212. Then, the region to be an nFET is doped with phosphorus (P), arsenic (As), or the like to form third impurity regions 215, and the region to be a pFET is doped with boron (B) or the like to form fourth impurity regions 216. Then, heat treatment (preferably, 800° C. to 1100° C.) is performed for activation. Then, a metal film for forming a silicide is formed. Here, a cobalt film is formed as the metal film. Then, heat treatment such as RTA (at 500° C. for one minute) is performed to make silicon in a portion in contact with the cobalt film into silicide. Then, the cobalt film is selectively removed, whereby silicides 217, 218, and 219 are formed. Then, heat treatment is performed at a temperature higher than that of the heat treatment for silicidation in order to reduce resistance in the silicide portion. This step is illustrated in a process cross-sectional view of FIG. 17D.

Then, an interlayer insulating film 220 is formed, and contact plugs 221 which reach the silicide 217 and the silicide 218 are formed. With the above steps, an nFET 222 and a pFET 223 can be manufactured using the single crystal semiconductor layer 112 fixed to the semiconductor substrate 111. This step is illustrated in a process cross-sectional view of FIG. 17E.

A CMOS structure can be formed by combining the nFET 222 and the pFET 223 complementarily. In addition, a wide variety of semiconductor devices can be formed by using such a semiconductor element.

Impurity concentration and crystal defects are reduced in the single crystal semiconductor layer formed by the method described in the above embodiment mode; therefore, a semiconductor element having excellent electric characteristics can be formed by using the SOI substrate described in Embodiment Mode 1 or Embodiment Mode 2.

This embodiment mode can be implemented in combination with any of the other embodiment modes, as appropriate.

Embodiment Mode 4

In this embodiment mode, a method for manufacturing a semiconductor device different from that in Embodiment Mode 3 will be described as an example of a method for manufacturing a semiconductor device including a semiconductor element having high performance and high reliability with high yield. Note that in a method for manufacturing a semiconductor device described in this embodiment mode, an opening for connection between a semiconductor layer and a wiring is formed in a self-aligned manner.

First, an SOI substrate manufactured by the method described in Embodiment Mode 1 or Embodiment Mode 2 is prepared (not illustrated). Then, a single crystal semiconductor layer in the semiconductor substrate is patterned into an island shape to form an island-shaped semiconductor layer 606, and then an insulating layer 608 serving as a gate insulating layer and a conductive layer serving as a gate electrode (or a wiring) are formed in this order. In this embodiment mode, the conductive layer serving as a gate electrode is formed to have a two layer structure; however, this embodiment mode is not limited thereto. Here, the insulating layer 608 can be formed using a material such as silicon oxide, silicon oxynitride, silicon nitride oxide, or silicon nitride by a CVD method, a sputtering method, or the like. The thickness of the insulating layer 608 may be equal to or more than about 5 nm and equal to or less than about 100 nm. The conductive layer can be formed using a material such as tantalum (Ta), tungsten (W), titanium (Ti), molybdenum (Mo), aluminum (Al), copper (Cu), chromium (Cr), or niobium (Nb) by a CVD method, a sputtering method, or the like. The total thickness of the conductive layer may be equal to or more than about 100 nm and equal to or less than about 500 nm. Note that in this embodiment mode, a case will be described in which the insulating layer 608 is formed using silicon oxide (with a thickness of 20 nm), the conductive layer (a lower layer) is formed using tantalum nitride (with a thickness of 50 nm), and the conductive layer (an upper layer) is formed using tungsten (with a thickness of 200 nm).

Note that in order to control the threshold voltage of the thin film transistor, an impurity imparting p-type conductivity, such as boron, aluminum, or gallium or an impurity imparting n-type conductivity, such as phosphorus or arsenic, may be added into the above-described single crystal semiconductor layer. For example, in the case of adding boron as an impurity imparting p-type conductivity, boron may be added at a concentration of equal to or more than $5 \times 10^{16}$ cm$^{-3}$ and equal to or less than $1 \times 10^{17}$ cm$^{-3}$. Further, hydrogenation treatment may be performed on the single crystal semiconductor layer. The hydrogenation treatment is performed for example, at 350° C. in a hydrogen atmosphere for approximately two hours.

Next, the conductive layers serving as a gate electrode are patterned. Note that in a method for manufacturing a thin film transistor in this embodiment mode, patterning is performed on the conductive layers at least twice, and here, first patterning is performed. As a result of this, a conductive layer 610 and a conductive layer 612 which are slightly larger than the gate electrode which is to be formed finally are formed. Here, the phrase "slightly larger" herein means a size with which a resist mask for forming the gate electrode in a second patterning step can be formed in accordance with the position of the conductive layer 610 and the conductive layer 612. Note that the two patterning steps may be performed on a region overlapping with the island-shaped semiconductor layer 606 which is a conductive layer and the two patterning steps do not need to be performed on the entire surface of the conductive layer.

Figure 18A:
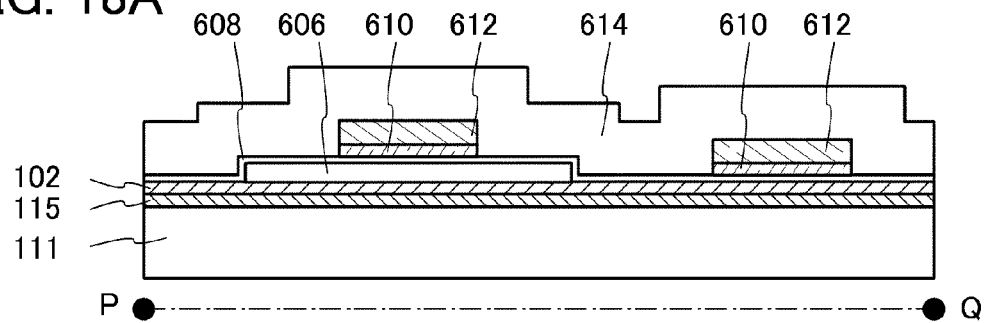
FIGS. 18A to 18D are diagrams illustrating an example of a method for manufacturing a semiconductor device using an SOI substrate.
Figure 20A:
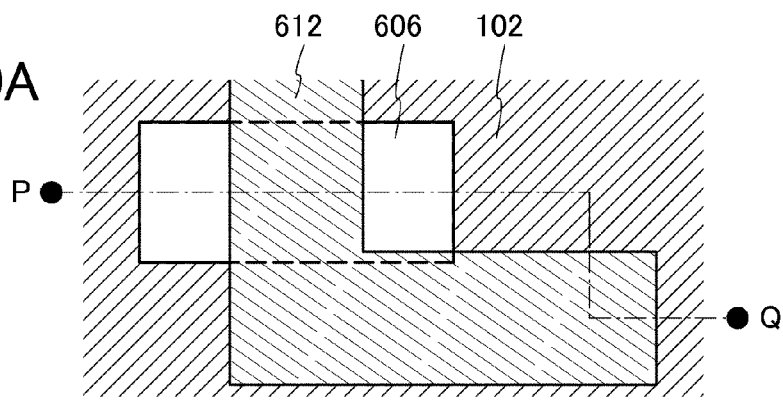
FIGS. 20A to 20D are diagrams illustrating an example of a method for manufacturing a semiconductor device using an SOI substrate.

Then, an insulating layer 614 is formed so as to cover the insulating layer 608, the conductive layer 610, and the conductive layer 612 (see FIG. 18A and FIG. 20A). Here, the insulating layer 614 can be formed using a material such as silicon oxide, silicon oxynitride, silicon nitride oxide, silicon nitride, hafnium oxide, or aluminum oxide by a CVD method, a sputtering method, or the like. The thickness of the insulating layer 614 is preferably equal to or more than about 0.5 μm and equal to or less than about 2 μm. In this embodiment mode, the case where the insulating layer 614 is formed using silicon oxide (with a thickness of 1 μm) will be described as an example. Note that in this embodiment mode, the SOI substrate in which the oxide film 115, the oxide film 102, and the semiconductor layer 606 are stacked sequentially over the semiconductor substrate 111 is described; however, this embodiment mode is not limited thereto.

Figure 18B:
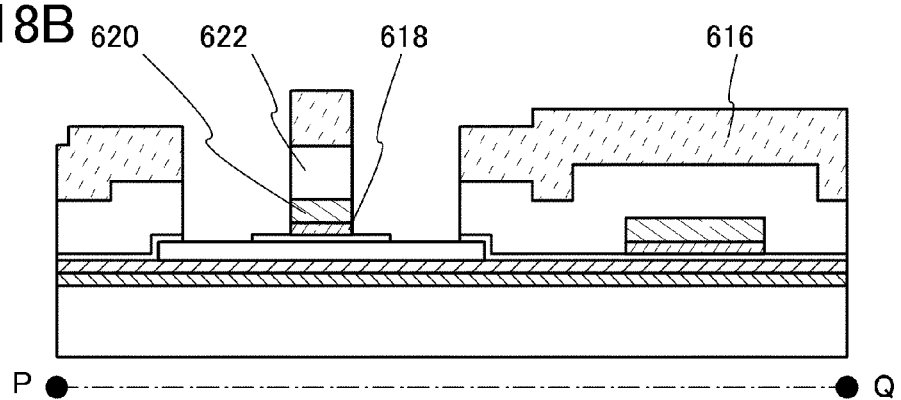
Figure 18C:
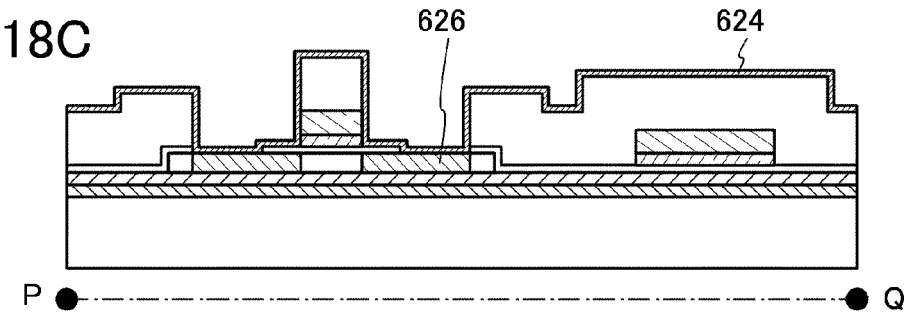
Figure 18D:
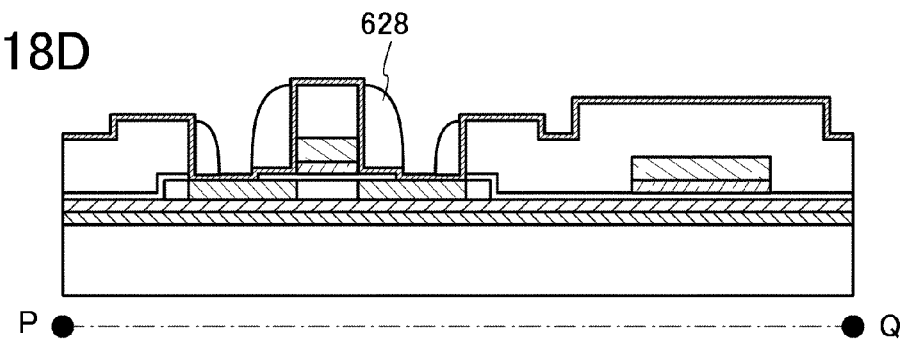
Figure 20B:
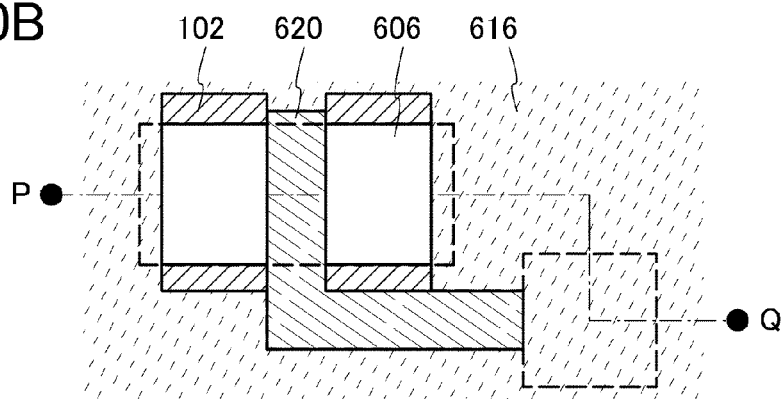

Note that FIG. 18A is a view corresponding to a cross section taken along line P-Q of FIG. 20A which is a plane view. Similarly, FIG. 18B, FIG. 18D and FIG. 18C are views corresponding to cross sections taken along lines P-Q of FIG. 20B, FIG. 20C and FIG. 20D, respectively. In the plane views illustrated in FIGS. 20A to 20D, some components in the corresponding cross-sectional views are omitted for simplicity.

Next, a resist mask 616 for forming a gate electrode, which is used in a patterning step, is formed over the insulating layer 614. The patterning step corresponds to the second patterning of the first patterning and the second patterning which are performed on the conductive layers. The resist mask 616 can be formed in such a manner that a resist material which is a photosensitive substance is applied, and then a pattern is exposed to light. After formation of the resist mask 616, the conductive layer 610, the conductive layer 612, and the insulating layer 614 are patterned with use of the resist mask 616. Specifically, the insulating layer 614 is selectively etched to form an insulating layer 622, and then the conductive layer 610 and the conductive layer 612 are selectively etched to form a conductive layer 618 and a conductive layer 620 which serve as a gate electrode (see FIG. 18B and FIG. 20B). Here, when the insulating layer 614 is selectively etched, part of the insulating layer 608 which serves as a gate insulating layer is also etched at the same time.

Next, the resist mask 616 is removed, and then an insulating layer 624 is formed so as to cover the island-shaped semiconductor layer 606, the insulating layer 608, the conductive layer 618, the conductive layer 620, the insulating layer 622, and the like. The insulating layer 624 serves as a barrier layer at the time of forming sidewalls later. Although the insulating layer 624 can be formed using a material such as silicon oxide, silicon oxynitride, silicon nitride oxide, silicon nitride, hafnium oxide, aluminum oxide, or tantalum oxide, it is preferable to form the insulating layer 624 using a material having etching selectivity with respect to a material used for the sidewalls later in order to make the insulating layer 624 serve as a barrier layer. The thickness of the insulating layer 624 may be equal to or more than about 10 nm and equal to or less than about 200 nm. In this embodiment mode, the insulating layer 624 is formed using silicon nitride (with a thickness of 50 nm).

After formation of the insulating layer 624, an impurity element imparting one conductivity type is added to the island-shaped semiconductor layer 606 using the conductive layer 618, the conductive layer 620, the insulating layer 622, and the like as masks. In this embodiment mode, an impurity element imparting n-type conductivity (e.g., phosphorus or arsenic) is added to the island-shaped semiconductor layer 606. By addition of the impurity element, impurity regions 626 are formed in the island-shaped semiconductor layer 606 (see FIG. 18C). Note that in this embodiment mode, after formation of the insulating layer 624, an impurity element imparting n-type conductivity is added; however, this embodiment mode is not limited thereto. For example, after or before removal of the resist mask, the impurity element may be added, and then the insulating layer 624 may be formed. An impurity element to be added can also be an impurity element imparting p-type conductivity.

Figure 20C:
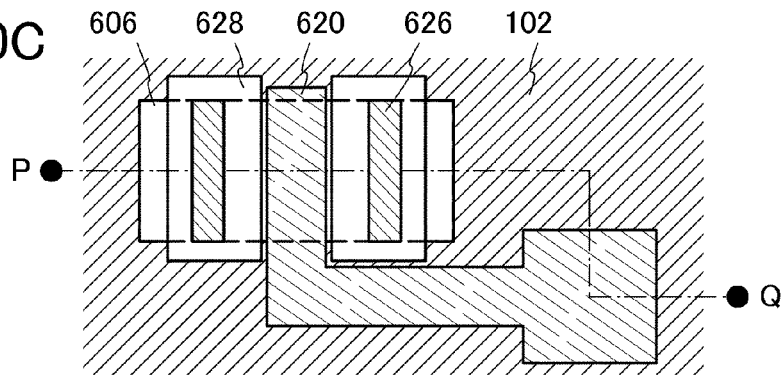

Next, sidewalls 628 are formed (see FIG. 18D and FIG. 20C). The sidewalls 628 can be formed in such a manner that an insulating layer is formed so as to cover the insulating layer 624 and anisotropic etching mainly in a perpendicular direction is performed on the insulating layer. This is because the insulating layer is selectively etched by the above-described anisotropic etching. The insulating layer can be formed using a material such as silicon oxide, silicon oxynitride, silicon nitride oxide, silicon nitride, hafnium oxide, aluminum oxide, or tantalum oxide by a CVD method, a sputtering method, or the like. Further, a film containing an organic material may be formed by a spin coating method, or the like. In this embodiment mode, silicon oxide is used as a material for the insulating layer. That is, the sidewalls 628 are formed using silicon oxide. In addition, as an etching gas, a mixed gas of $CHF_3$ and helium can be used, for example. Note that the step of forming the sidewalls 628 is not limited to this example.

Next, an impurity element imparting one conductivity type is added to the island-shaped semiconductor layer 606 using the insulating layer 622, the sidewalls 628, and the like as masks. Note that the impurity element imparting one conductivity type added to the island-shaped semiconductor layer 606 at this time has the same conductivity type as the impurity element that has been added to the island-shaped semiconductor layer 606 in the previous step, and is added at a higher concentration than that of the impurity element added in the previous step. That is, in this embodiment mode, an impurity element imparting n-type conductivity is added.

By addition of the impurity element, a channel formation region 630, low-concentration impurity regions 632, and high-concentration impurity regions 634 are formed in the island-shaped semiconductor layer 606. The low-concentration impurity regions 632 each serve as a lightly doped drain (LDD) region, and the high-concentration impurity regions 634 each serve as a source or a drain.

Figure 19A:
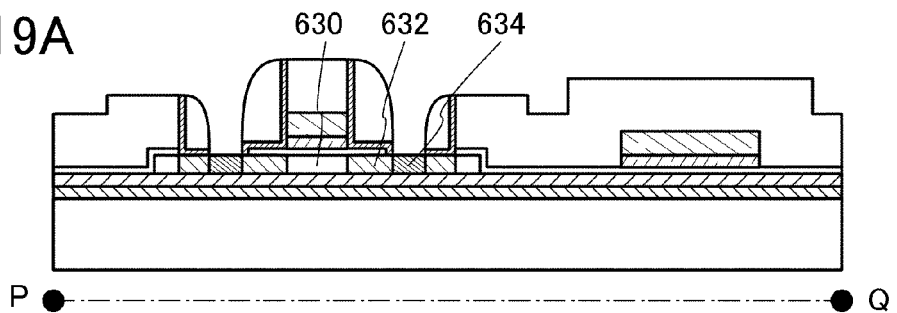
FIGS. 19A to 19C are diagrams illustrating an example of a method for manufacturing a semiconductor device using an SOI substrate.

Next, the insulating layer 624 is etched to form openings (contact holes) which reach the high-concentration impurity regions (see FIG. 19A). Since the insulating layer 622 and the sidewalls 628 are formed using silicon oxide and the insulating layer 624 is formed using silicon nitride in this embodiment mode, the insulating layer 624 can be selectively etched to form the openings.

Figure 19B:
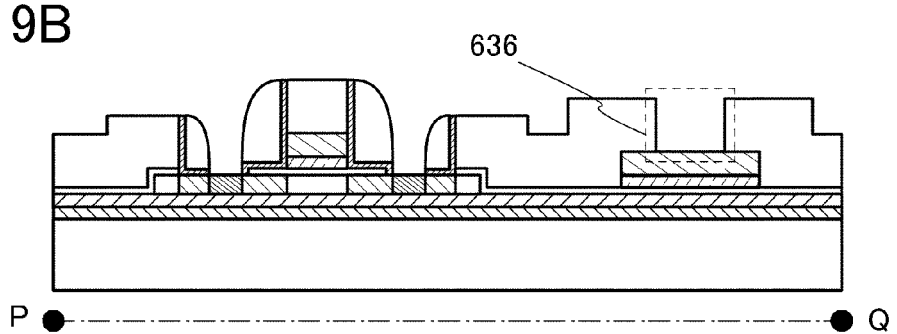

After formation of the openings which reach the high-concentration impurity regions, the insulating layer 614 is selectively etched to form an opening 636 (see FIG. 19B). The opening 636 is formed larger than the openings which reach the high-concentration impurity regions. This is because a minimum line width of the opening 636 is determined in accordance with a process rule or a design rule, while the openings which reach the high-concentration impurity regions are miniaturized by being formed in a self-aligned manner.

Then, a conductive layer which is in contact with the high-concentration impurity regions 634 in the island-shaped semiconductor layer 606 and the conductive layer 612 is formed through the openings which reach the high-concentration impurity regions and the opening 636. The conductive layer can be formed by a CVD method, a sputtering method, or the like. As a material of the conductive layer, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Moreover, an alloy containing the above-described metal as the main component or a compound containing the above-described metal may be used. The conductive layer may have a single-layer structure or a stacked-layer structure. In this embodiment mode, the case is described in which the conductive layer has a three-layer structure of titanium, aluminum, and titanium.

Figure 19C:
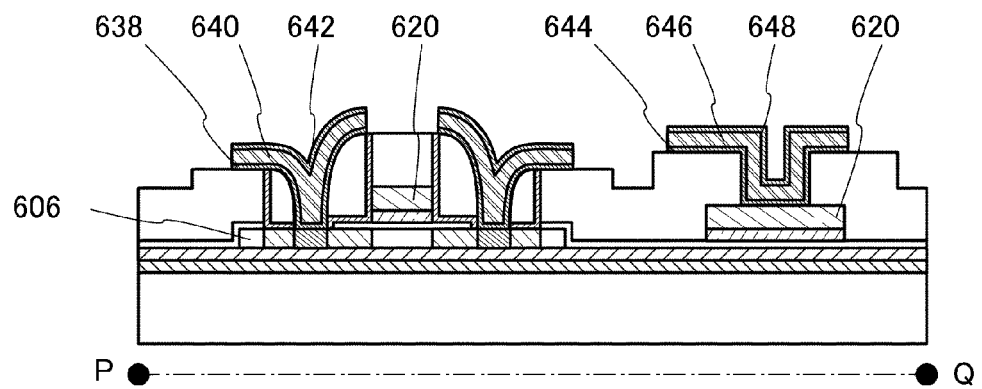
Figure 20D:
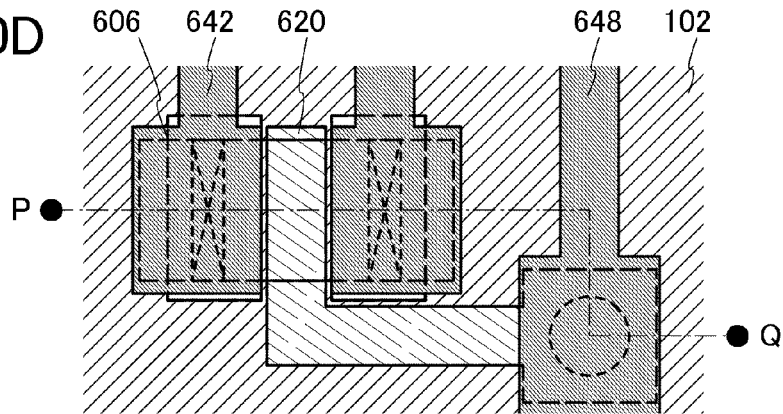

The conductive layer is selectively etched to form a conductive layer 638, a conductive layer 640 and a conductive layer 642 which serve as a source or drain electrode (a source or drain wiring), and a conductive layer 644, a conductive layer 646 and a conductive layer 648 which are connected to the conductive layer 620 and serve as a wiring (see FIG. 19C and FIG. 20D). Through the steps, a thin film transistor in which a connection between the island-shaped semiconductor layer 606 and the conductive layer serving as the source or drain electrode is formed in a self-aligned manner is completed.

The single crystal semiconductor layer formed by the method described in the above embodiment mode has reduced impurity concentration, reduced crystal defects, and higher planarity. Therefore, a semiconductor element having high reliability and excellent electric characteristics can be formed by using the SOI substrate described in Embodiment Mode 1 or Embodiment Mode 2.

Since a connection relationship of the source or drain electrode can be formed in a self-aligned manner by the method described in this embodiment mode, a structure of the transistor can be miniaturized. That is, the degree of integration of semiconductor elements can be increased. Further, since a length of the channel or the low-concentration impurity region can be determined in a self-aligned manner, variation in channel resistance, which is a problem in miniaturization, can be suppressed. That is, a transistor with excellent characteristics can be provided.

A semiconductor device with high added value can be manufactured by forming various semiconductor elements such as TFTs or FETs using the SOI substrates described in Embodiment Mode 1 or Embodiment Mode 2.

Embodiment Mode 5

Although the method for manufacturing a transistor has been described using Embodiment Mode 3 and Embodiment Mode 4, a semiconductor device can be manufactured so as to have high added value by forming a variety of semiconductor elements such as a capacitor and a resistor, together with the transistor. Hereinafter, specific modes of semiconductor devices will be described using drawings.

Figure 21:
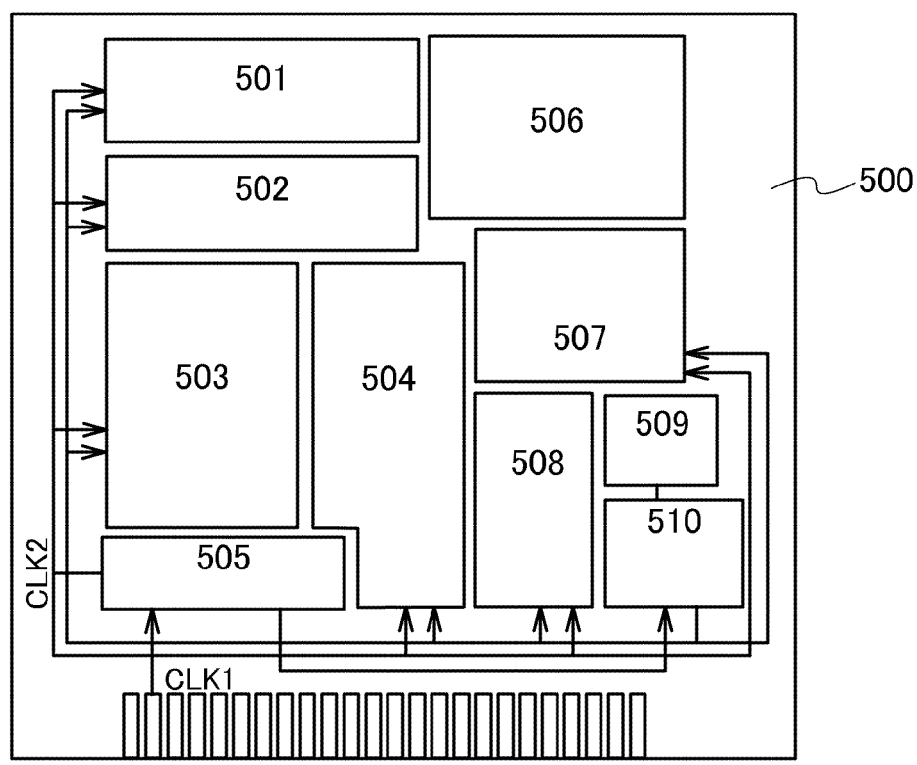
FIG. 21 is a diagram illustrating an example of a semiconductor device using an SOI substrate.

First, as an example of a semiconductor device, a microprocessor is described. FIG. 21 is a block diagram illustrating a structural example of a microprocessor 500.

The microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory 509, and a memory interface 510.

An instruction input to the microprocessor 500 through the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction.

Specifically, the ALU controller 502 generates a signal for controlling operation of the arithmetic logic unit 501. While the microprocessor 500 is executing a program, the interrupt controller 504 judges an interrupt request from an external input and output device or a peripheral circuit based on its priority or a mask state, and processes the interrupt request. The register controller 507 generates an address of the register 506, and reads/writes data from/to the register 506 in accordance with the state of the microprocessor 500. The timing controller 505 generates signals for controlling timing of operation of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As illustrated in FIG. 21, the internal clock signal CLK2 is input to other circuits.

Figure 22:
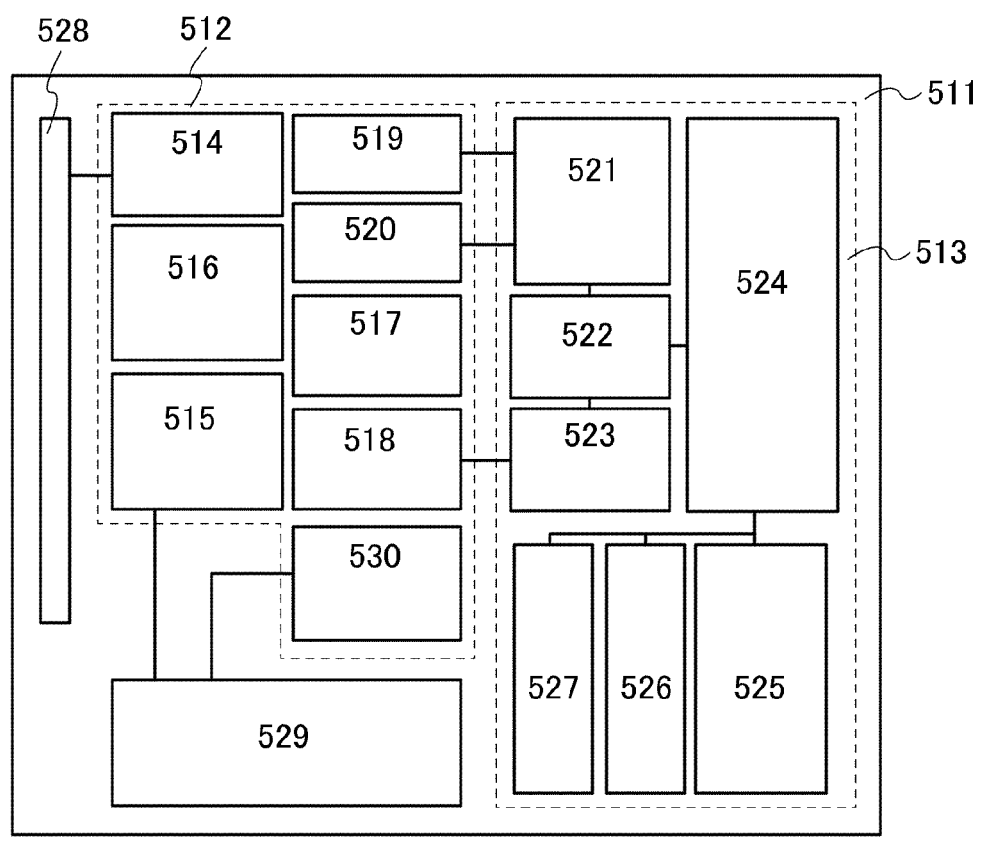
FIG. 22 is a diagram illustrating an example of a semiconductor device using an SOI substrate.

Next, an example of a semiconductor device having a function of transmitting and receiving data without contact and also having an arithmetic function will be described. FIG. 22 is a block diagram illustrating a structural example of such a semiconductor device. The semiconductor device illustrated in FIG. 22 can be called a computer which operates to transmit and receive signals to and from an external device through wireless communication (hereinafter the computer is referred to as an RFCPU).

As illustrated in FIG. 22, an RFCPU 511 includes an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, and a modulation circuit 520. The digital circuit portion 513 includes an RF interface 521, a control register 522, a clock controller 523, an interface 524, a central processing unit 525, a random access memory 526, and a read only memory 527.

The operation of the RFCPU 511 is roughly described below. The resonance circuit 514 generates induced electromotive force based on a signal received at an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily integrated over the same substrate as the RFCPU 511 and may be incorporated into the RFCPU 511 as a component.

The reset circuit 517 generates a signal that resets the digital circuit portion 513 to be initialized. For example, a signal which rises with a delay to a rise of the power supply voltage is generated as a reset signal. The oscillator circuit 518 changes the frequency and the duty ratio of a clock signal in accordance with a control signal generated by the constant voltage circuit 516. The demodulation circuit 519 demodulates a received signal, and the modulation circuit 520 modulates data to be transmitted.

For example, the demodulation circuit 519 is formed using a low-pass filter and binarizes a received signal of an amplitude shift keying (ASK) system based on variation of the amplitude. The modulation circuit 520 transmits transmission data by changing the amplitude of a transmission signal of the amplitude shift keying (ASK) system. The modulation circuit 520 changes the resonance point of the resonance circuit 514, whereby the amplitude of a communication signal is changed.

The clock controller 523 generates a control signal for changing the frequency and the duty ratio of the clock signal in accordance with the power supply voltage or current consumption in the central processing unit 525. The power supply voltage is monitored by a power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like.

The central processing unit 525 accesses the read only memory 527, the random access memory 526, and the control register 522 via the interface 524. The interface 524 has a function of generating an access signal for any of the read only memory 527, the random access memory 526, and the control register 522 based on an address requested by the central processing unit 525.

As an arithmetic method of the central processing unit 525, a method may be employed in which the read only memory 527 stores an operating system (OS) and a program is read at the time of starting operation and then executed. Alternatively, a method in which a circuit dedicated to arithmetic is formed and an arithmetic processing is conducted using hardware may be employed. In a method in which both hardware and software are used, part of arithmetic processing can be conducted by a circuit dedicated to arithmetic, and the other part of the arithmetic processing can be conducted by the central processing unit 525 using a program.

Figure 23A:
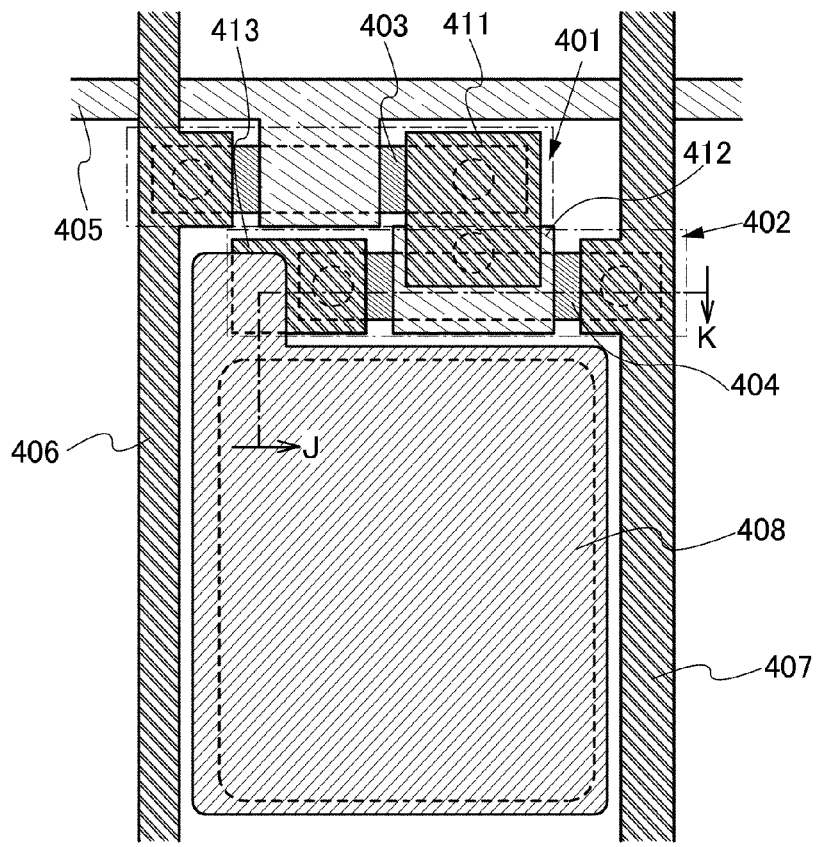
FIGS. 23A and 23B illustrate an example of a semiconductor device using an SOI substrate.
Figure 23B:
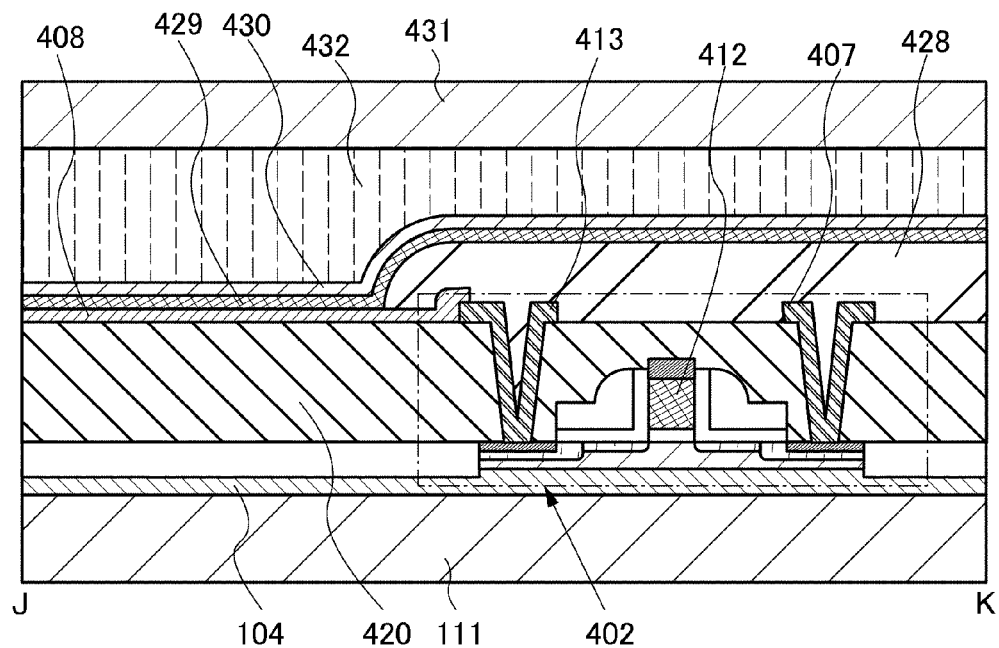

Next, an electroluminescent display device (hereinafter referred to as an "EL display device") is described as an example of a display device with reference to FIGS. 23A and 23B. FIG. 23A illustrates a plan view of a pixel of the EL display device, and FIG. 23B illustrates a cross-sectional view of FIG. 23A taken along section line J-K. A so-called top emission type EL display device can be formed by using the transistor described in Embodiment Mode 3 or Embodiment Mode 4.

As illustrated in FIG. 23A, the pixel includes a selection transistor 401, a display control transistor 402, a scan line 405, a signal line 406, a current supply line 407, and a pixel electrode 408. Each pixel is provided with a light-emitting element having a structure in which a layer including an electroluminescent material (this layer is also referred to as an EL layer) is sandwiched between a pair of electrodes. One electrode of the light emitting element is the pixel electrode 408. The active layer of the selection transistor 401 and the display control transistor 402 is formed using a single crystal semiconductor layer provided over the semiconductor substrate 111.

In the selection transistor 401, a gate electrode is included in the scan line 405, one of a source electrode and a drain electrode is included in the signal line 406, and the other thereof is formed as an electrode 411. In the display control transistor 402, a gate electrode 412 is electrically connected to the electrode 411, one of a source electrode and a drain electrode is formed as an electrode 413 which is electrically connected to the pixel electrode 408, and the other is included in the current supply line 407.

The display control transistor 402 is a p-channel FET in this embodiment mode. Since details of the display control transistor 402 are similar to those of the pFET 223 described in the above embodiment mode, specific description is omitted here. Although a p-channel FET is used as a display control transistor in this embodiment mode, this embodiment mode is not limited thereto, an n-channel FET may be used. In a similar manner, either an n-channel FET or a p-channel FET can be used for the selection transistor.

An interlayer insulating film 420 is formed so as to cover the gate electrode 412 or the like of the display control transistor 402. Over the interlayer insulating film 420, the signal line 406, the current supply line 407, the electrode 411, the electrode 413, and the like are formed. Over the interlayer insulating film 420, the pixel electrode 408 which is electrically connected to the electrode 413 is formed. A peripheral portion of the pixel electrode 408 is surrounded by a partition wall layer 428 having an insulating property. An EL layer 429 is formed over the pixel electrode 408, and a counter electrode 430 is formed over the EL layer 429. A counter substrate 431 is provided as a reinforcing plate, and the counter substrate 431 is fixed to the semiconductor substrate 111 with a resin layer 432.

In the SOI substrate described in Embodiment Mode 1 or Embodiment Mode 2, crystal defects and impurity concentration of the single crystal semiconductor layer are reduced; therefore, semiconductor elements in which variation in characteristics between elements is small can be formed with high yield by using the SOI substrate. This semiconductor element is applied to a driver circuit of an EL display device, whereby operating speed or voltage retention capability due to a leakage current reduction effect can be improved, and a display device having high definition and high performance can be formed. In addition, this semiconductor element is applied to a pixel circuit of an EL display device, whereby variation in characteristics between pixels can be suppressed and display quality can be improved.

The grayscale of the EL display device is controlled by a current drive method by which the luminance of the light-emitting element is controlled by the amount of current and a voltage drive method by which the luminance is controlled by the amount of voltage. The current drive method is difficult to adapt when transistors have very different characteristics for every pixel, and therefore a compensation circuit for compensating variation in characteristics is necessary. Crystal defects and impurity concentration of the single crystal semiconductor layer in the SOI substrate described in Embodiment Mode 1 or Embodiment Mode 2 are reduced in manufacturing steps. Therefore, when an EL display device is formed using the SOI substrate, the selection transistor 401 and the display control transistor 402 do not have variation in characteristics between pixels, whereby a current drive method can be adopted.

Embodiment Mode 6

A semiconductor device such as transistors is formed using the SOI substrate described in Embodiment Mode 1 or Embodiment Mode 2, whereby various electronic devices can be completed by using this semiconductor device. Since impurity concentration of the single crystal semiconductor layer provided for the SOI substrate described in Embodiment Mode 1 or Embodiment Mode 2 is reduced, the single crystal semiconductor layer is used as an active layer, whereby leakage current can be reduced and semiconductor elements of which electric characteristics are improved can be formed. In addition, crystal defects of the single crystal semiconductor layer are reduced; therefore, localized state density can be reduced at the interface with a gate insulating layer. Further, the single crystal semiconductor layer has high planarity; therefore, a thin gate insulating layer having high withstand voltage can be formed over the single crystal semiconductor layer, whereby improvement in mobility, improvement in subthreshold swing, or suppression of a short channel effect of a formed semiconductor element can be realized. That is, an SOI substrate described in Embodiment Mode 1 or Embodiment Mode 2 is used, whereby a semiconductor element having high current drive capability and high reliability can be formed. As a result, electronic devices as end products can be formed with high throughput and high quality. In this embodiment mode, specific examples of the application of electronic devices are described with reference to drawings.

Figure 24A:
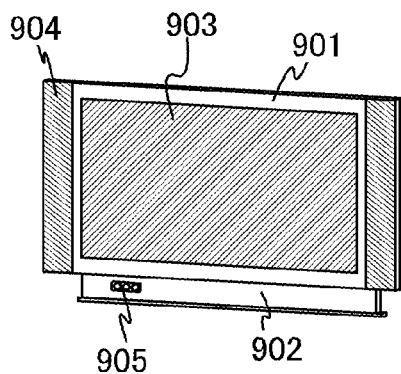
FIGS. 24A to 24F are diagrams each illustrating an example of an electronic device using an SOI substrate.

FIG. 24A illustrates a display device including a chassis 901, a supporting base 902, a display portion 903, a speaker portion 904, a video input terminal 905, and the like. This display device is formed using the transistor formed by the manufacturing method described in the other embodiment modes for a driver IC, the display portion 903, and the like. The display device includes a liquid crystal display device, a light-emitting display device, and the like, and moreover includes all the information displaying devices for computers, television reception, advertisement display, and so on. Specifically, a display, a head mount display, a reflection type projector, and the like can be given.

Figure 24B:
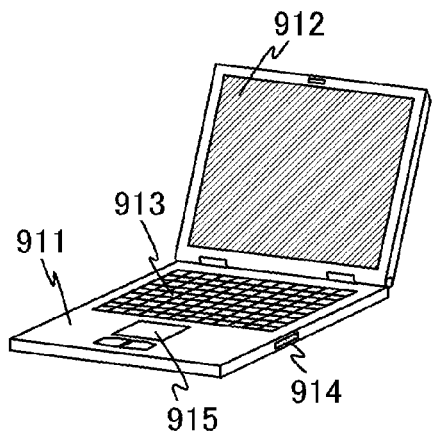

FIG. 24B illustrates a computer including a chassis 911, a display portion 912, a keyboard 913, an external connection port 914, a pointing device 915, and the like. A transistor formed according to the above embodiment mode can be applied not only to a pixel portion in the display portion 912 but also to a semiconductor device such as a driver IC for display, a CPU inside a main body, or a memory.

Figure 24C:
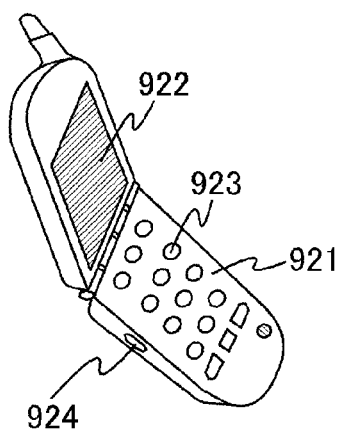

FIG. 24C illustrates a mobile phone as a typical example of mobile information processing terminals. The mobile phone includes a chassis 921, a display portion 922, an operation key 923, and the like. A transistor formed according to the above embodiment mode can be applied not only to a pixel portion in the display portion 922 and a sensor portion 924, but also to a driver IC for display, a memory, an audio processing circuit, and the like. The sensor portion 924 includes an optical sensor element, by which the luminance of the display portion 922 is controlled according to the illuminance of the sensor portion 924, and by which the illumination brightness of the operation key 923 is controlled according to the illuminance of the sensor portion 924. Thus, the power consumption of the mobile phone can be suppressed.

The semiconductor elements formed by using Embodiment Mode 3 or Embodiment Mode 4 can also be used for electronic devices such as personal digital assistants (PDA), digital cameras, small game machines, portable sound reproducing devices, and the like as well as the mobile phone. For example, it is possible to apply the semiconductor elements to functional circuits such as CPUs, memories, or sensors or to pixel portions of such an electronic device or a driver IC for display.

Figure 24D:
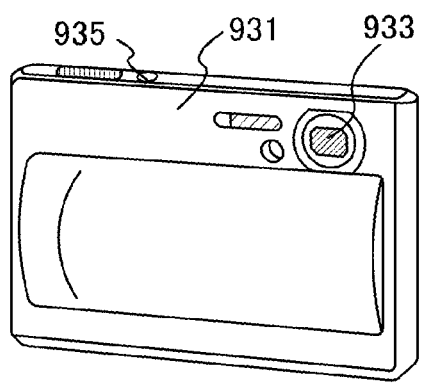
Figure 24E:
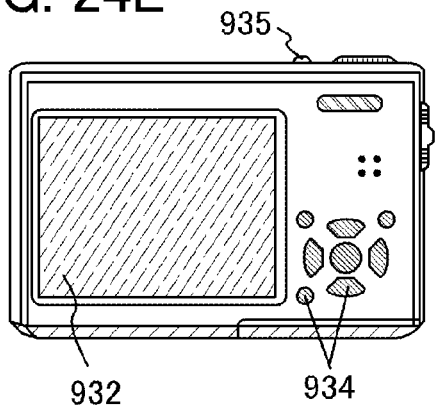

FIGS. 24D and 24E illustrate a digital camera. FIG. 24E illustrates a rear side of the digital camera illustrated in FIG. 24D. This digital camera includes a chassis 931, a display portion 932, a lens 933, operating keys 934, a shutter button 935, and the like. The transistors formed in accordance with the above embodiment mode can be used for a pixel portion of the display portion 932, a driver IC for driving the display portion 932, a memory, a light-receiving element, and the like.

Figure 24F:
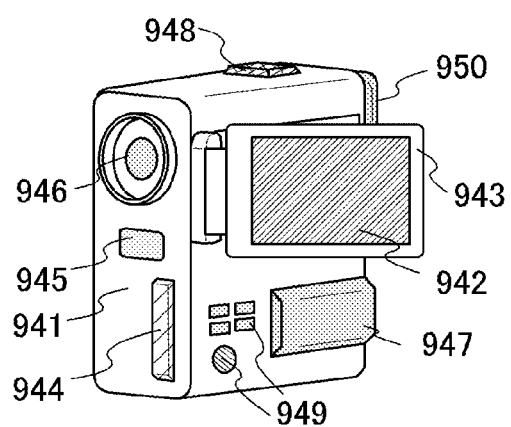

FIG. 24F illustrates a digital video camera. This digital video camera includes a main body 941, a display portion 942, a chassis 943, an external connection port 944, a remote control receiving portion 945, an image receiving portion 946, a battery 947, an audio input portion 948, an operation key 949, an eye-piece portion 950, and the like. The transistors formed in accordance with the above embodiment mode can be used for a pixel portion of the display portion 942, a driver IC for driving the display portion 942, a memory, a digital input processor, a light-receiving element, and the like.

Besides, this embodiment mode can be applied to a navigation system, a sound reproducing device, an image reproducing device equipped with a recording medium, and the like. The transistors formed in accordance with the above embodiment mode can be applied to pixel portions of display portions of these devices, driver ICs for controlling the display portions, memories, digital input processors, sensor portions, and the like.

Figure 25A:
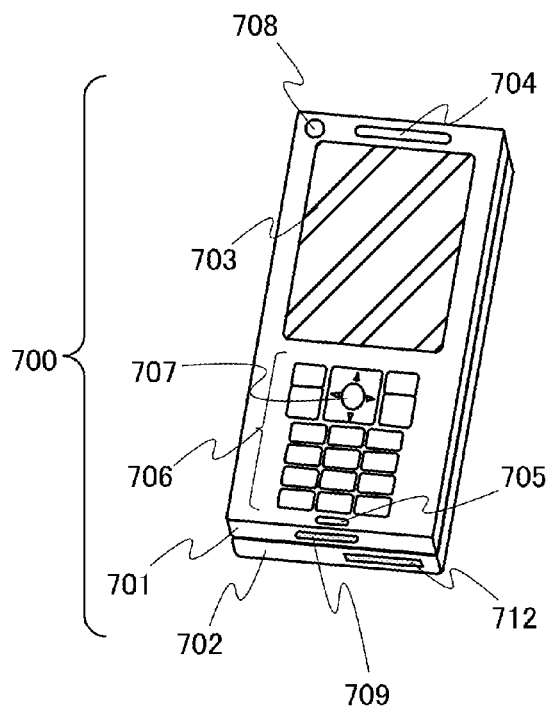
FIGS. 25A to 25C are diagrams illustrating an example of an electronic device using an SOI substrate.
Figure 25B:
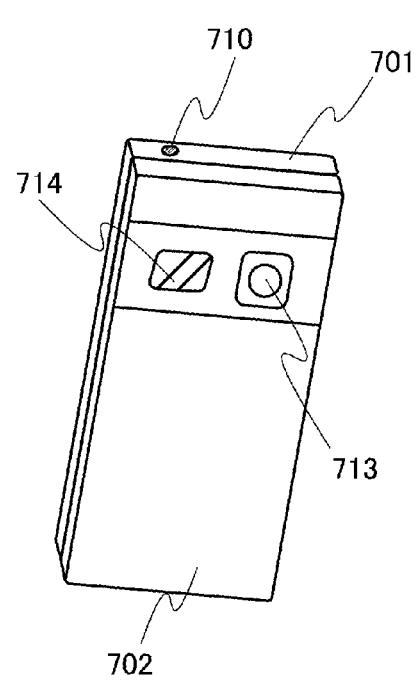
Figure 25C:
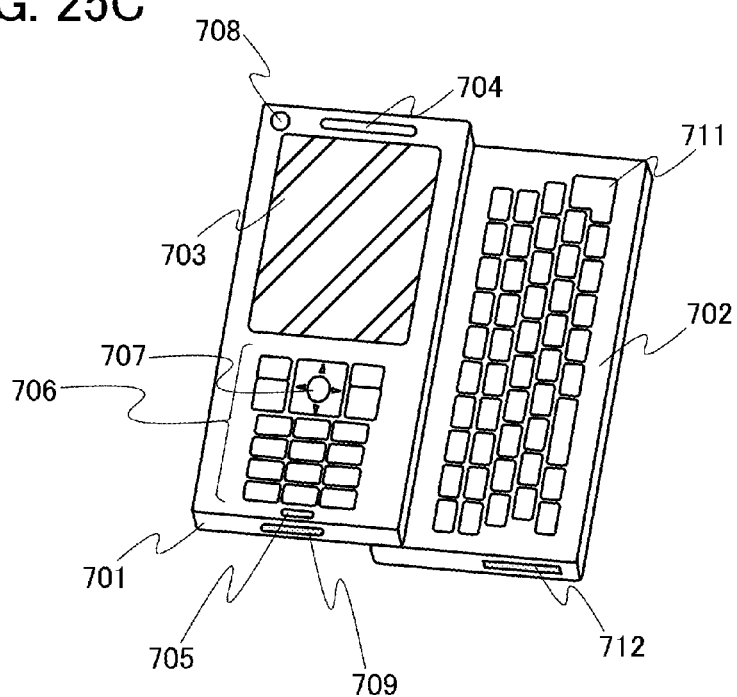

FIGS. 25A to 25C illustrate another example of a mobile phone to which the transistor formed in accordance with the above embodiment mode is applied. FIG. 25A is a front view, and FIG. 25B is a rear view, and FIG. 25C is a front view in which two chassis are slid. A mobile phone 700 has both functions of a mobile phone and a portable information terminal, and incorporates a computer. The mobile phone 700 is a "smartphone," with which a variety of data processing is possible in addition to telephone conversation.

The mobile phone 700 has chassis 701 and 702. The chassis 701 includes a display portion 703, a speaker 704, a microphone 705, operation keys 706, a pointing device 707, a camera lens 708, an external connection terminal 709, an earphone terminal 710, and the like. The chassis 702 includes a keyboard 711, an external memory slot 712, a rear camera 713, a light 714, and the like. In addition, an antenna is incorporated in the chassis 701. The semiconductor elements formed in accordance with the above embodiment mode can be used for a pixel portion of the display portion 703, a driver IC for driving the display portion 703, a memory, an audio processing circuit, and the like. By applying the EL display device illustrated in FIGS. 23A and 23B to the display portion 703, the display portion 703 can display excellent image quality with little display unevenness.

Further, in addition to the above structure, the mobile phone 700 may incorporate a non-contact IC chip, a small memory device, or the like.

The chassis 701 and 702 which overlap with each other (see FIG. 25A) can be slid, and are spread as illustrated in FIG. 25C. Since the camera lens 708 is provided in the same plane as the display portion 703, the mobile phone can be used as a videophone. Further, a still image and a moving image can be taken with the rear camera 713 and the light 714, using the display portion 703 as a viewfinder.

With the use of the speaker 704 and the microphone 705, the mobile phone 700 can be used as an audio recording device (recording device) or an audio playing device. With the use of the operation keys 706, further, operations of incoming and outgoing of calls, simple information input such as electronic mail, scrolling of a screen, cursor movement, e.g., for selecting information to be displayed on the display portion, and the like are possible.

If much information needs to be treated in documentation, a use as a portable information terminal, and the like, it is convenient to use the keyboard 711. By sliding the chassis 701 and 702 which overlap with each other (FIG. 25A), the chassis 701 and 702 can be spread as illustrated in FIG. 25C. In the case where the mobile phone is used as a portable information terminal, smooth operation with the keyboard 711 and the pointing device 707 can be performed. The external connection terminal 709 can be connected to an AC adapter and various types of cables such as a USB cable, and charging and data communication with a personal computer are possible. Further, by inserting a recording medium in the external memory slot 712, a larger amount of data can be stored and transferred.

The rear face of the chassis 702 (see FIG. 25B) is provided with the rear camera 713 and the light 714, and a still image and a moving image can be taken using the display portion 703 as a viewfinder.

Further, the mobile phone may have an infrared communication function, a USB port, a function of receiving one segment television broadcast, a non-contact IC chip, an earphone jack, or the like, in addition to the above-described functions and structures.

As thus described, the range of application for semiconductor devices manufactured in accordance with the above embodiment mode is so wide that the semiconductor devices by using the SOI substrate described in Embodiment Mode 1 or Embodiment Mode 2 as a material can be applied to electronic devices of any field.

This application is based on Japanese Patent Application serial No. 2008-079650 filed with Japan Patent Office on Mar. 26, 2008, the entire contents of which are hereby incorporated by reference.

What is claimed is:

1. A method for manufacturing an SOI substrate, comprising the steps of:
    forming a first oxide film on a surface of a single crystal semiconductor substrate by performing first thermal oxidation treatment on the single crystal semiconductor substrate;
    forming an embrittlement region in the single crystal semiconductor substrate by irradiating the single crystal semiconductor substrate with ions through the first oxide film;
    bonding a surface of the first oxide film over the single crystal semiconductor substrate and a first surface of a semiconductor substrate;
    forming a single crystal semiconductor layer over the semiconductor substrate with the first oxide film interposed therebetween by separating the single crystal semiconductor substrate by heat treatment at the embrittlement region;
    irradiating the single crystal semiconductor layer with a laser beam in an inert atmosphere;
    forming a second oxide film over the single crystal semiconductor layer and a second surface of the semiconductor substrate by performing second thermal oxidation treatment; and
    removing the second oxide film.

2. The method for manufacturing an SOI substrate according to claim 1,
    wherein a hydrogen gas is used for a source gas for the step of forming the embrittlement region, and
    wherein plasma containing $H_3^+$ is generated by exciting the hydrogen gas, and the embrittlement region is formed by accelerating ions contained in the plasma and irradiating the single crystal semiconductor substrate with the ions.

3. The method for manufacturing an SOI substrate according to claim 1,
    wherein the first thermal oxidation treatment is performed in an atmosphere containing halogen, and
    wherein the first oxide film contains the halogen of equal to or more than $1\times10^{16}$ atoms/cm$^3$ and equal to or less than $2\times10^{21}$ atoms/cm$^3$.

4. The method for manufacturing an SOI substrate according to claim 1,
    wherein the second thermal oxidation treatment is performed in an atmosphere containing halogen, and
    wherein the second oxide film contains the halogen of equal to or more than $1\times10^{16}$ atoms/cm$^3$ and equal to or less than $2\times10^{21}$ atoms/cm$^3$.

5. The method for manufacturing an SOI substrate according to claim 1,
    wherein the first thermal oxidation treatment is performed in an atmosphere containing chlorine.

6. The method for manufacturing an SOI substrate according to claim 1,
    wherein the second thermal oxidation treatment is performed in an atmosphere containing chlorine.

7. The method for manufacturing an SOI substrate according to claim 1,
    wherein the semiconductor substrate is any of a single crystal silicon substrate, a polycrystalline silicon substrate, and a solar grade silicon substrate.

8. The method for manufacturing an SOI substrate according to claim 1, wherein the second surface of the semiconductor substrate is a side surface of the semiconductor substrate.

9. The method for manufacturing an SOI substrate according to claim 1, wherein the second surface of the semiconductor substrate is opposite to the first surface of the semiconductor substrate.

10. A method for manufacturing an SOI substrate, comprising the steps of:
    forming a first oxide film on a surface of a single crystal semiconductor substrate by performing first thermal oxidation treatment on the single crystal semiconductor substrate;
    forming an embrittlement region in the single crystal semiconductor substrate by irradiating the single crystal semiconductor substrate with ions through the first oxide film;
    bonding a surface of the first oxide film over the single crystal semiconductor substrate and a first surface of a semiconductor substrate;
    forming a single crystal semiconductor layer over the semiconductor substrate with the first oxide film interposed therebetween by separating the single crystal semiconductor substrate by heat treatment at the embrittlement region;
    irradiating the single crystal semiconductor layer with a laser beam to planarize a surface of the single crystal semiconductor layer in an inert atmosphere;
    forming a second oxide film over the single crystal semiconductor layer and a second surface of the semiconductor substrate by performing second thermal oxidation treatment; and
    removing the second oxide film.

11. The method for manufacturing an SOI substrate according to claim 10,
    wherein a hydrogen gas is used for a source gas for the step of forming the embrittlement region, and
    wherein plasma containing $H_3^+$ is generated by exciting the hydrogen gas, and the embrittlement region is formed by accelerating ions contained in the plasma and irradiating the single crystal semiconductor substrate with the ions.

12. The method for manufacturing an SOI substrate according to claim 10,
    wherein the first thermal oxidation treatment is performed in an atmosphere containing halogen, and wherein the first oxide film contains the halogen of equal to or more than $1\times10^{16}$ atoms/cm$^3$ and equal to or less than $2\times10^{21}$ atoms/cm$^3$.

13. The method for manufacturing an SOI substrate according to claim 10,
wherein the second thermal oxidation treatment is performed in an atmosphere containing halogen, and
wherein the second oxide film contains the halogen of equal to or more than $1\times10^{16}$ atoms/cm$^3$ and equal to or less than $2\times10^{21}$ atoms/cm$^3$.

14. The method for manufacturing an SOI substrate according to claim 10,
wherein the first thermal oxidation treatment is performed in an atmosphere containing chlorine.

15. The method for manufacturing an Sal substrate according to claim 10,
wherein the second thermal oxidation treatment is performed in an atmosphere containing chlorine.

16. The method for manufacturing an SOI substrate according to claim 10,
wherein the semiconductor substrate is any of a single crystal silicon substrate, a polycrystalline silicon substrate, and a solar grade silicon substrate.

17. The method for manufacturing an SOI substrate according to claim 10, wherein the second surface of the semiconductor substrate is a side surface of the semiconductor substrate.

18. The method for manufacturing an SOI substrate according to claim 10, wherein the second surface of the semiconductor substrate is opposite to the first surface of the semiconductor substrate.

19. A method for manufacturing a semiconductor device, comprising the steps of:
forming a first oxide film on a surface of a single crystal semiconductor substrate by performing first thermal oxidation treatment on the single crystal semiconductor substrate;
forming an embrittlement region in the single crystal semiconductor substrate by irradiating the single crystal semiconductor substrate with ions through the first oxide film;
bonding a surface of the first oxide film over the single crystal semiconductor substrate and a first surface of a semiconductor substrate;
forming a single crystal semiconductor layer over the semiconductor substrate with the first oxide film interposed therebetween by separating the single crystal semiconductor substrate by heat treatment at the embrittlement region;
irradiating the single crystal semiconductor layer with a laser beam in an inert atmosphere;
forming a second oxide film over the single crystal semiconductor layer and a second surface of the semiconductor substrate by performing second thermal oxidation treatment;
removing the second oxide film; and
forming a semiconductor element using the single crystal semiconductor layer over the semiconductor substrate.

20. The method for manufacturing a semiconductor device according to claim 19,
wherein a hydrogen gas is used for a source gas for the step of forming the embrittlement region, and
wherein plasma containing $H_3^+$ is generated by exciting the hydrogen gas, and the embrittlement region is formed by accelerating ions contained in the plasma and irradiating the single crystal semiconductor substrate with the ions.

21. The method for manufacturing a semiconductor device according to claim 19,
wherein the first thermal oxidation treatment is performed in an atmosphere containing halogen, and
wherein the first oxide film contains the halogen of equal to or more than $1\times10^{16}$ atoms/cm$^3$ and equal to or less than $2\times10^{21}$ atoms/cm$^3$.

22. The method for manufacturing a semiconductor device according to claim 19,
wherein the second thermal oxidation treatment is performed in an atmosphere containing halogen, and
wherein the second oxide film contains the halogen of equal to or more than $1\times10^{16}$ atoms/cm$^3$ and equal to or less than $2\times10^{21}$ atoms/cm$^3$.

23. The method for manufacturing a semiconductor device according to claim 19, wherein the semiconductor substrate is any of a single crystal silicon substrate, a polycrystalline silicon substrate, and a solar grade silicon substrate.

24. The method for manufacturing a semiconductor device according to claim 19, wherein the semiconductor element is a field effect transistor.

25. The method for manufacturing a semiconductor device according to claim 19, wherein the second surface of the semiconductor substrate is a side surface of the semiconductor substrate.

26. The method for manufacturing a semiconductor device according to claim 19, wherein the second surface of the semiconductor substrate is opposite to the first surface of the semiconductor substrate.

27. A method for manufacturing a semiconductor device, comprising the steps of:
forming a first oxide film on a surface of a single crystal semiconductor substrate by performing first thermal oxidation treatment on the single crystal semiconductor substrate;
forming an embrittlement region in the single crystal semiconductor substrate by irradiating the single crystal semiconductor substrate with ions through the first oxide film;
bonding a surface of the first oxide film over the single crystal semiconductor substrate and a first surface of a semiconductor substrate;
forming a single crystal semiconductor layer over the semiconductor substrate with the first oxide film interposed therebetween by separating the single crystal semiconductor substrate by heat treatment at the embrittlement region;
irradiating the single crystal semiconductor layer with a laser beam to planarize a surface of the single crystal semiconductor layer in an inert atmosphere;
forming a second oxide film over the single crystal semiconductor layer and a second surface of the semiconductor substrate by performing second thermal oxidation treatment;
removing the second oxide film; and
forming a semiconductor element using the single crystal semiconductor layer over the semiconductor substrate.

28. The method for manufacturing a semiconductor device according to claim 27,
wherein a hydrogen gas is used for a source gas for the step of forming the embrittlement region, and
wherein plasma containing $H_3^+$ is generated by exciting the hydrogen gas, and the embrittlement region is formed by accelerating ions contained in the plasma and irradiating the single crystal semiconductor substrate with the ions.

29. The method for manufacturing a semiconductor device according to claim 27, wherein the first thermal oxidation treatment is performed in an atmosphere containing halogen, and wherein the first oxide film contains the halogen of equal to or more than $1\times10^{16}$ atoms/cm$^3$ and equal to or less than $2\times10^{21}$ atoms/cm$^3$.

30. The method for manufacturing a semiconductor device according to claim 27, wherein the second thermal oxidation treatment is performed in an atmosphere containing halogen, and wherein the second oxide film contains the halogen of equal to or more than $1\times10^{16}$ atoms/cm$^3$ and equal to or less than $2\times10^{21}$ atoms/cm$^3$.

31. The method for manufacturing a semiconductor device according to claim 27, wherein the semiconductor substrate is any of a single crystal silicon substrate, a polycrystalline silicon substrate, and a solar grade silicon substrate.

32. The method for manufacturing a semiconductor device according to claim 27, wherein the semiconductor element is a field effect transistor.

33. The method for manufacturing a semiconductor device according to claim 27, wherein the second surface of the semiconductor substrate is a side surface of the semiconductor substrate.

34. The method for manufacturing a semiconductor device according to claim 27, wherein the second surface of the semiconductor substrate is opposite to the first surface of the semiconductor substrate.

* * * * *

UNITED STATES PATENT AND TRADEMARK OFFICE
CERTIFICATE OF CORRECTION

PATENT NO. : 8,021,958 B2  
APPLICATION NO. : 12/410654  
DATED : September 20, 2011  
INVENTOR(S) : Shunpei Yamazaki et al.

Page 1 of 1

It is certified that error appears in the above-identified patent and that said Letters Patent is hereby corrected as shown below:

At column 2, line 23, "the take time" should be --the takt time--;

At column 11, line 8, "time step At" should be --time step Δt--;

At column 22, line 64, "1G" should be --1G.--;

At column 37, line 16, "Sal" should be --SOI--.

Signed and Sealed this  
Twenty-second Day of November, 2011

David J. Kappos  
*Director of the United States Patent and Trademark Office*